US010170192B2

(12) United States Patent
Park et al.

(10) Patent No.: US 10,170,192 B2
(45) Date of Patent: Jan. 1, 2019

(54) NONVOLATILE MEMORY DEVICE

(71) Applicant: SAMSUNG ELECTRONICS CO., LTD., Suwon-si, Gyeonggi-Do (KR)

(72) Inventors: June-Hong Park, Hwaseong-si (KR); Ki-Whan Song, Seoul (KR); Bong-Soon Lim, Seoul (KR); Su-Chang Jeon, Seoul (KR); Jin-Young Kim, Seoul (KR); Chang-Yeon Yu, Hwaseong-si (KR); Dong-Kyo Shim, Seoul (KR); Seong-Jin Kim, Gimpo-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/717,992

(22) Filed: Sep. 28, 2017

(65) Prior Publication Data
US 2018/0226128 A1 Aug. 9, 2018

(30) Foreign Application Priority Data
Feb. 6, 2017 (KR) .................. 10-2017-0016409

(51) Int. Cl.
*G11C 16/10* (2006.01)
*G11C 16/04* (2006.01)
*G11C 16/08* (2006.01)
*G11C 16/24* (2006.01)

(52) U.S. Cl.
CPC .......... *G11C 16/10* (2013.01); *G11C 16/0483* (2013.01); *G11C 16/08* (2013.01); *G11C 16/24* (2013.01)

(58) Field of Classification Search
CPC ...... G11C 16/10; G11C 16/08; G11C 16/0483; G11C 16/24
USPC ............. 365/185.17, 185.21, 185.23, 185.25
See application file for complete search history.

(56) References Cited

U.S. PATENT DOCUMENTS

| 7,679,966 | B2 | 3/2010 | Kang et al. |
| 8,144,521 | B2 | 3/2012 | Park |
| 8,310,891 | B2 | 11/2012 | Kim et al. |
| 8,755,224 | B2 | 6/2014 | Yun et al. |
| 8,773,914 | B2 | 7/2014 | Lee et al. |
| 9,042,175 | B2 | 5/2015 | Sim et al. |
| 9,378,826 | B2 * | 6/2016 | Lee ........................ G11C 16/10 |
| 2006/0291288 | A1 | 12/2006 | Kang et al. |
| 2010/0091576 | A1 * | 4/2010 | Kwon ................ G11C 16/0483 365/185.25 |

(Continued)

*Primary Examiner* — Tan T. Nguyen
(74) *Attorney, Agent, or Firm* — Volentine, Whitt & Francos, PLLC

(57) ABSTRACT

A nonvolatile memory device including a memory cell array having a plurality of planes; a plurality of page buffers arranged corresponding to each of the plurality of planes; and a control logic circuit configured to transmit a bit line setup signal to each of the plurality of page buffers. Each of the plurality of page buffers includes a precharge circuit configured to precharge a sensing node and a bit line in response to the bit line setup signal, and a shutoff circuit configured to perform a bit line shutoff operation in response to a bit line shutoff signal. The control logic circuit is configured to control a transition time when a level of the bit line setup signal is changed according to a gradient of the bit line shutoff signal which is changed from a first level to a second level.

20 Claims, 17 Drawing Sheets

(56) References Cited

U.S. PATENT DOCUMENTS

2012/0026797 A1* 2/2012 Kim .................. G11C 16/0483
365/185.18
2014/0029339 A1 1/2014 Sakamoto et al.
2016/0314833 A1* 10/2016 Lee .................... G11C 11/5635

* cited by examiner

| DISTANCE | INTERVAL VALUE |
|---|---|
| NEAR-PLANE1 | t2_A |
| NEAR-PLANE2 | t2_B |
| FAR-PLANE1 | t2_C |
| FAR-PLANE2 | t2_D |

| # OF PLANE GROUP | INTERVAL VALUE |
|---|---|
| 1 | t2_A' |
| 2 | t2_B' |
| 4 | t2_C' |
| 8 | t2_D' |

NONVOLATILE MEMORY DEVICE

CROSS-REFERENCE TO RELATED APPLICATION

A claim of priority under 35 U.S.C. § 119 is made to Korean Patent Application No. 10-2017-0016409, filed on Feb. 6, 2017, in the Korean Intellectual Property Office, the entire contents of which are hereby incorporated by reference.

BACKGROUND

The present inventive concept herein relates to a nonvolatile memory device, and more particularly to a nonvolatile memory device including a page buffer for reading data stored in a memory cell and a control logic circuit for transmitting a control signal to the page buffer, and a programming method of the nonvolatile memory device.

Semiconductor memory devices may be implemented using semiconductor materials such as silicon (Si), germanium (Ge), gallium arsenide (GaAs), or indium phosphide (InP). Semiconductor memory devices may be categorized as either volatile memory devices or nonvolatile memory devices.

In nonvolatile memory devices, stored data is not lost even if power supply is interrupted. Examples of nonvolatile memory devices include read-only memory (ROM), programmable ROM (PROM), electrically programmable ROM (EPROM), electrically erasable programmable ROM (EEPROM), flash memory devices, phase-change random-access memory (PRAM), magnetic RAM (MRAM), resistive RAM (RRAM), and ferroelectric RAM (FRAM). Flash memory devices may be categorized as either NOR type or NAND type.

Examples of devices which are implemented using nonvolatile memory include MP3 players, digital cameras, mobile phones, camcorders, flash cards, and solid state disks (SSD). As the number of devices implemented with nonvolatile memory storage devices has increased and as technology has advanced, the capacity of nonvolatile memory has rapidly increased.

SUMMARY

Embodiments of the inventive concept provide a nonvolatile memory device capable of effectively sensing an on-cell and an off-cell while reducing time taken to sense data stored in a memory cell.

Embodiments of the inventive concept provide a nonvolatile memory device including a memory cell array having a plurality of planes; a plurality of page buffers arranged corresponding to each of the plurality of planes; and a control logic circuit configured to transmit a bit line setup signal to each of the plurality of page buffer. Each of the plurality of page buffers includes a precharge circuit configured to precharge a sensing node and a bit line in response to the bit line setup signal, and a shutoff circuit configured to perform a bit line shutoff operation in response to a bit line shutoff signal. The control logic circuit is configured to control a transition time when a level of the bit line setup signal is changed according to a gradient of the bit line shutoff signal which is changed from a first level to a second level.

Embodiments of the inventive concept further provide a nonvolatile memory device including a memory cell array having a plurality of planes; a plurality of page buffers connected to each of the plurality of planes; and a control logic circuit configured to transmit a bit line setup signal to each of the plurality of page buffers. Each of the plurality of page buffers includes a precharge circuit configured to precharge a sensing node and a bit line in response to the bit line setup signal, and a shutoff circuit configured to perform a bit line shutoff operation in response to a bit line shutoff signal. The control logic circuit is configured to change a level of the bit line setup signal based on a result of comparing a level of the bit line shutoff signal with a level of a reference voltage.

Embodiments of the inventive concept still further provide a nonvolatile memory device including a memory cell array having a plurality of planes; and a plurality of page buffers arranged as respectively corresponding to the plurality of planes. Each of the plurality of page buffers is configured to precharge a sensing node and a bit line in a corresponding plane of the plurality planes responsive to a bit line setup signal, and to perform a shutoff operation responsive to a bit line shutoff signal. The nonvolatile memory device further includes a control logic circuit configured to generate the bit line setup signal as having a level that is changed at a transition time controlled according to a gradient of the bit line shutoff signal.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Hereinafter, the present disclosure will be described in detail with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
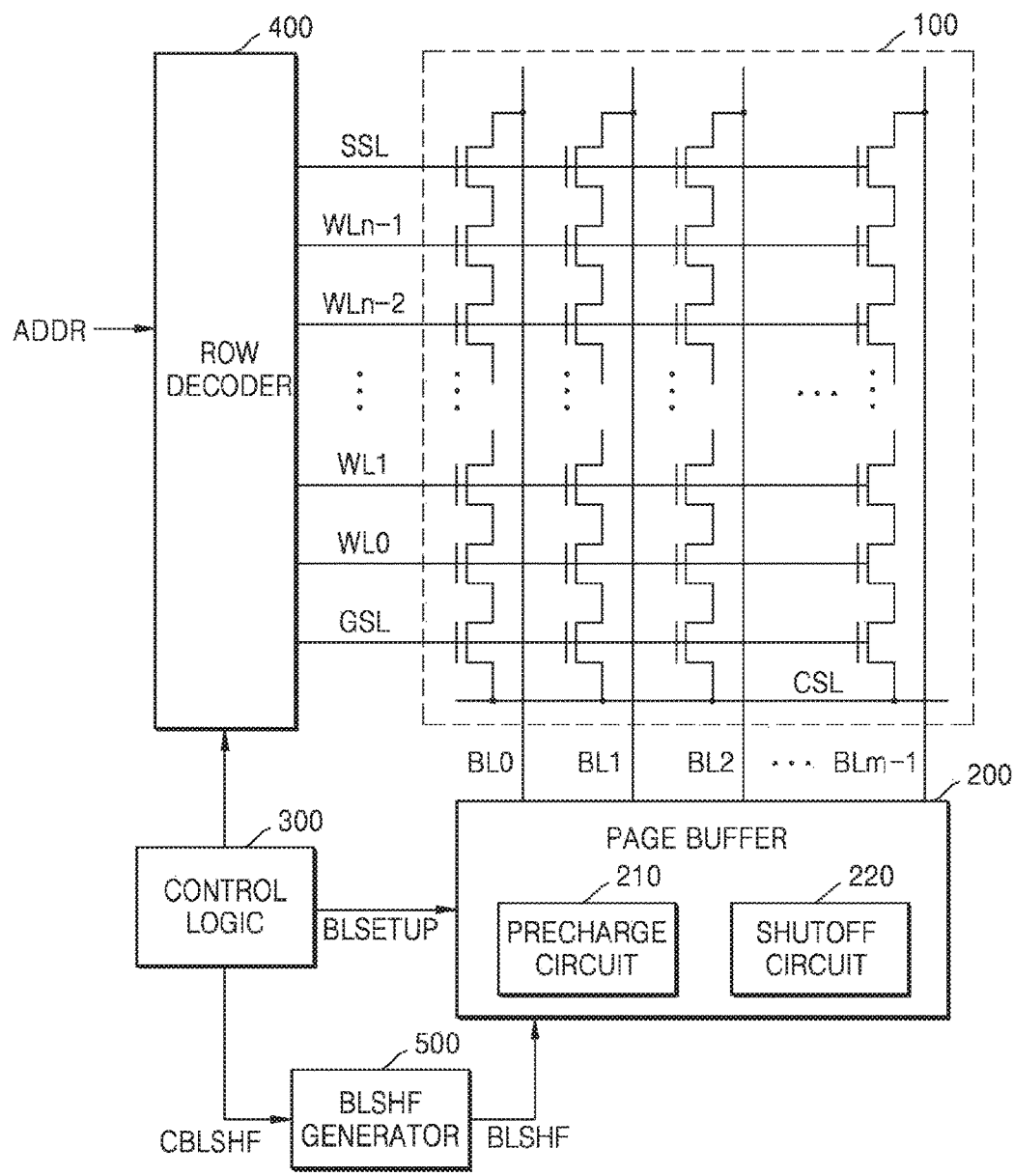
FIG. 1 illustrates a block diagram of a nonvolatile memory device according to example embodiments of the inventive concept.

FIG. 1 illustrates a block diagram of a nonvolatile memory device 1 according to example embodiments of the inventive concept.

Referring to FIG. 1, the nonvolatile memory device 1 includes a memory cell array 100, a page buffer 200, a control logic circuit 300, a row decoder 400, and a bit line shutoff signal generator 500. Although the nonvolatile memory device 1 is shown as a flash memory device, it is to be understood that the inventive concepts are not limited to flash memory devices, and that the inventive concepts may be applied to any type of nonvolatile memory devices (e.g., read-only memory (ROM), programmable ROM (PROM), electrically programmable ROM (EPROM), electrically erasable programmable ROM (EEPROM), a flash memory device, phase-change random-access memory (PRAM), magnetic RAM (MRAM), resistive RAM (RRAM), ferroelectric RAM (FRAM), or the like).

The memory cell array 100 may be connected to the row decoder 400 via word lines WLs (e.g., WL0, WL1, . . . WLn-2, WLn-1), a least one string selection line SSL, and at least one ground selection line GSL. The memory cell array 100 may be connected to the page buffer 200 via bit lines BL0 through BLm-1 (e.g., BL0, BL1, BL2, . . . BLm-1). In some example embodiments, the memory cell array 100 may include a three-dimensional (3D) memory cell array and a plurality of NAND cell strings. Each of the NAND cell strings may be connected to a bit line via a string selection transistor SST. The memory cell array 100 may be formed of a plurality of planes including a plurality of memory blocks, and the plurality of memory blocks may include a plurality of pages. The plurality of pages may include a plurality of memory cells. The memory cell array 100 will be described in detail with reference to FIGS. 2 through 5.

A plurality of bit lines may be divided into a plurality of bit line groups according to a programming order or a reading order. In some example embodiments, a plurality of bit lines may be divided into a plurality of bit line groups including a first bit line group and a second bit line group. For example, read operations for memory cells connected to the first bit line group may be sequentially performed for each string selection line, and then read operations for memory cells connected to the second bit line group may be sequentially performed for each string selection line. The plurality of bit line groups will be described in detail with reference to FIGS. 16 through 18.

Each memory cell included in the memory cell array 100 may store one or more bits. Specifically, each memory cell may be used as a single-level cell (SLC), a multi-level cell (MLC), or a triple-level cell (TLC), for example. In some example embodiments, some of the plurality of memory blocks included in the memory cell array 100 may be single-level cell blocks, and the other memory blocks may be multi-level cell blocks or triple-level cell blocks.

The page buffer 200 may operate as a write driver or as a sense amplifier depending on an operation mode. During a write operation, the page buffer 200 may transmit a bit line voltage corresponding to data to be written to a bit line of the memory cell array 100. During a read operation, the page buffer 200 may sense data stored in a selected memory cell through the bit line. The page buffer 200 may latch the sensed data and output the latched data to the outside.

The page buffer 200 includes a precharge circuit 210 and a shutoff circuit 220. The precharge circuit 210 may include at least one transistor controlled by a bit line setup signal BLSETUP, and the shutoff circuit 220 may include at least one transistor controlled by a bit line shutoff signal BLSHF.

The control logic circuit 300 may output various control signals for controlling the page buffer 200 and the row decoder 400 to perform a read operation in response to a command CMD. For example, the control logic circuit 300 may transmit the bit line setup signal BLSETUP to the precharge circuit 210.

The control logic circuit 300 may output a shutoff signal control signal CBLSHF to the bit line shutoff signal generator 500 for controlling the bit line shutoff signal generator 500. The control logic circuit 300 may control the bit line shutoff signal generator 500 to change the bit line shutoff signal BLSHF from a first level (e.g., a precharge voltage V_PRE) to a second level (e.g., a developing voltage V_DEV).

The bit line shutoff signal BLSHF may vary in terms of a gradient thereof changing from the first level to the second level depending on the number of planes simultaneously selected for a read operation. In addition, the gradient changing from the first level to the second level may vary depending on a distance by which the bit line shutoff signal BLSHF is transmitted to the page buffer 200. The control logic circuit 300 may control timing of changing a level of the bit line setup signal BLSETUP according to the gradient of the bit line shutoff signal BLSHF changing from the first level to the second level. In some example embodiments, the control logic circuit 300 may control timing of changing (i.e., a transition of) a level of the bit line setup signal BLSETUP based on a difference value between the first level and the second level of the bit line shutoff signal BLSHF.

The row decoder 400 may select any one of memory blocks of the memory cell array 100 in response to an address ADDR. The row decoder 400 may select any one of word lines of the selected memory block. The row decoder 400 may transmit a word line voltage from a voltage generator to the word line of the selected memory block.

The bit line shutoff signal generator 500 may generate the bit line shutoff signal BLSHF based on the shutoff signal control signal CBLSHF received from the control logic circuit 300 and may output the bit line shutoff signal BLSHF to the page buffer 200. The bit line shutoff signal BLSHF may have a voltage level that is independent of deviation of a power supply voltage supplied from the outside to the nonvolatile memory device 1. The bit line shutoff signal BLSHF may be provided to the shutoff circuit 220 of the page buffer 200. The bit line shutoff signal generator 500 may determine and output a voltage level of the bit line shutoff signal BLSHF according to voltages of a predetermined magnitude supplied from a voltage generator or the like.

Figure 2:
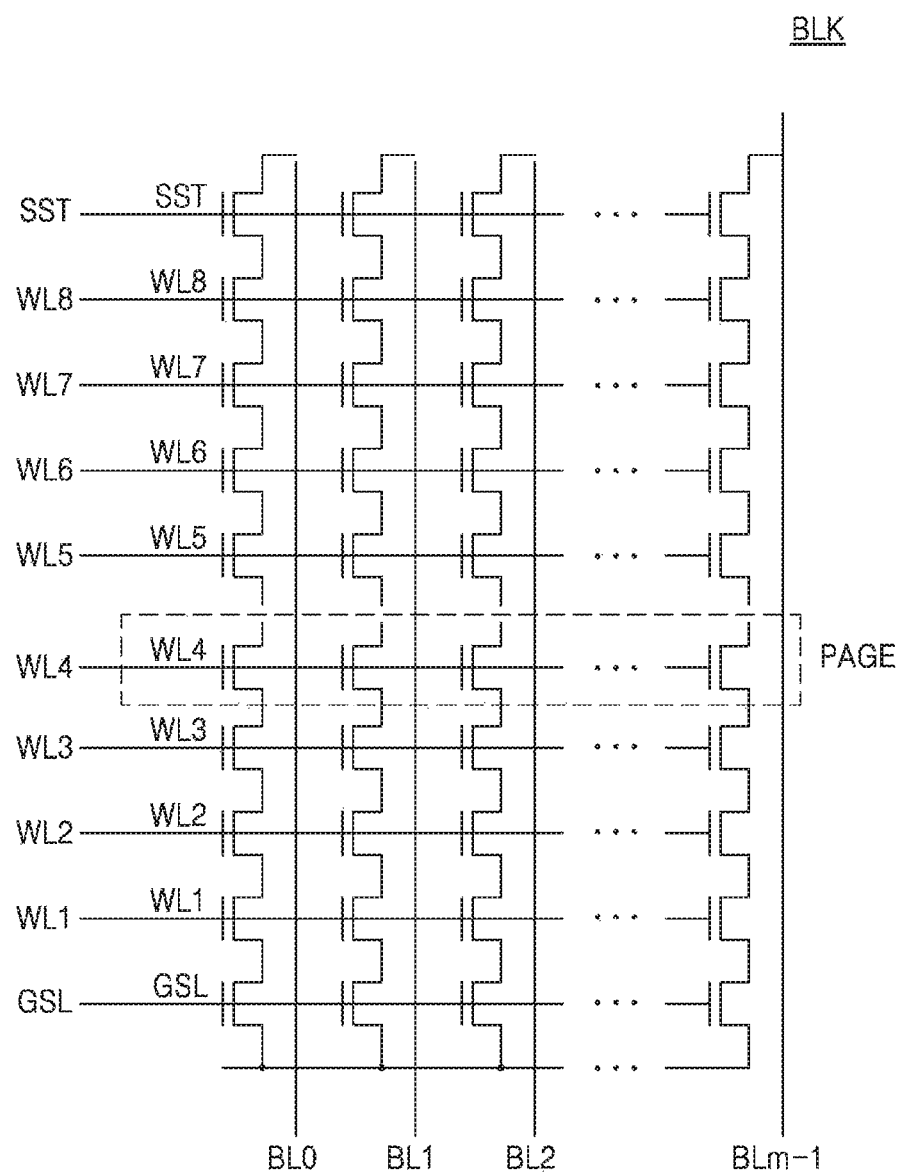
FIG. 2 illustrates a circuit diagram of a memory block according to example embodiments of the inventive concept.

FIG. 2 illustrates a circuit diagram of a memory block according to example embodiments of the inventive concept.

Referring to FIG. 2, for example, the memory cell array 100 (of FIG. 1) may be a memory cell array of a horizontal NAND flash memory, and may include a plurality of memory blocks. Each memory block BLK may include a plurality of pages PAGE including m memory cells MC in a direction perpendicular to each of bit lines BL0 through BLm-1, m being an integer greater than or equal to 1.

A NAND flash memory device having the structure as shown in FIG. 2 is erased on a block basis, and may execute a program in page units PAGE corresponding to each of word lines WL0 through WL7. FIG. 2 shows an example in which eight pages for eight word lines WL1 through WL8 are provided in one block. However, memory blocks of the memory cell array 100 according to example embodiments of the inventive concept may have a different number of memory cells and a different number of pages than the number of the memory cells MC and the pages PAGE shown in FIG. 2. In addition, the nonvolatile memory device 1 of FIG. 1 may include a plurality of memory cell arrays that perform the same operation with the same structure as the memory cell array 100 described above.

Figure 3:
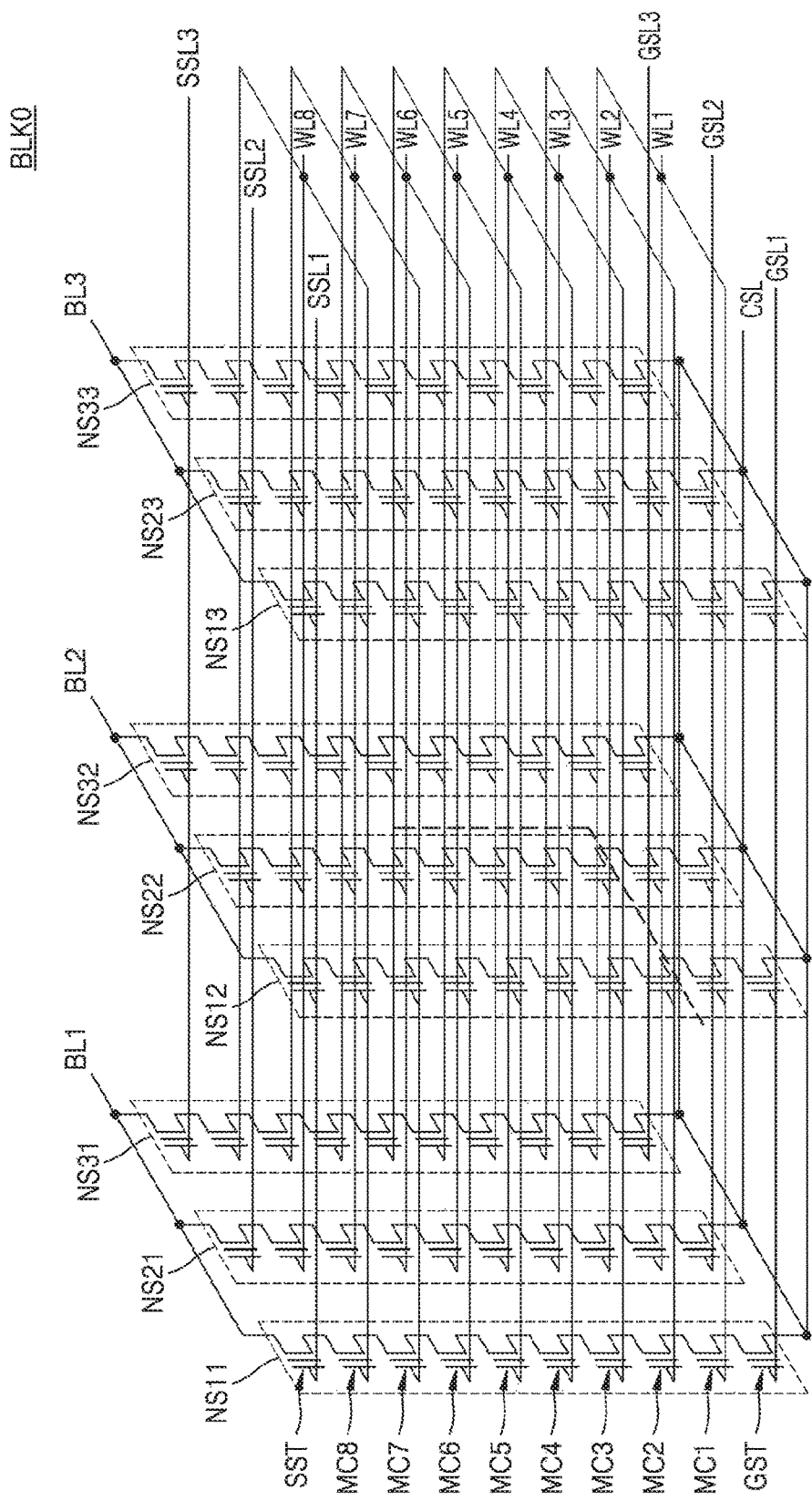
FIG. 3 illustrates a circuit diagram of another example of a memory block BLK0 included in a memory cell array, according to example embodiments of the inventive concept.

FIG. 3 illustrates a circuit diagram of another example of a memory block BLK0 included in a memory cell array, according to example embodiments of the inventive concept.

Referring to FIG. 3, for example, the memory cell array 100 (of FIG. 1) may be a memory cell array of a vertical NAND flash memory, and may include a plurality of memory blocks. Each memory block BLK0 may include a plurality of NAND strings NS11 through NS33, a plurality of word lines WL1 through WL8, a plurality of bit lines BL1 through BL3, a plurality of ground selection lines GSL1 through GSL3, a plurality of string selection lines SSL1 through SSL3, and a common source line CSL. Here, the number of NAND strings, the number of word lines, the number of bit lines, the number of ground selection lines, and the number of string selection lines may be variously changed according to example embodiments.

The NAND strings NS11, NS21 and NS31 may be provided between the first bit line BL1 and the common source line CSL, the NAND strings NS12, NS22 and NS32 may be provided between the second bit line BL2 and the common source line CSL, and the NAND strings NS13, NS23 and NS33 may be provided between the third bit line BL3 and the common source line CSL. Each NAND string (e.g., NS11) may include the string selection transistor SST, a plurality of memory cells MC1 through MC8, and a ground selection transistor GST that are connected in series.

Strings connected in common to a single bit line form one column. For example, the strings NS11, NS21 and NS31 connected in common to the first bit line BL1 may correspond to a first column, the strings NS12, NS22 and NS32 connected in common to the second bit line BL2 may correspond to a second column, and the strings NS13, NS23, NS33 connected in common to the third bit line BL3 may correspond to a third column.

Strings connected to one string selection line form one row. For example, the strings NS11, NS12 and NS13 connected to the first string selection line SSL1 may correspond to a first row, the strings NS21, NS22 and NS23 connected to the second string selection line SSL2 may correspond to a second row, and the strings NS31, NS32, NS33 connected to the third string selection line SSL3 may correspond to a third row.

The string selection transistors SST may be connected to the corresponding string selection lines SSL1 through SSL3. The plurality of memory cells MC1 through MC8 may be connected to the corresponding word lines WL1 to WL8, respectively. The ground selection transistors GST may be connected to the corresponding ground selection lines GSL1 through GSL3. The string selection transistors SST may be connected to the corresponding bit lines BL1 through BL3, and the ground selection transistors GST may be connected to the common source line CSL.

Word lines (e.g., WL1, WL2, etc.) having the same height are commonly connected to each other. The string selection lines SSL1 through SSL3 are separated from each other, and the selection lines GSL1 through GSL3 are also separated from each other. For example, when programming memory cells connected to the first word line WL1 and belonging to the strings NS11, NS12 and NS13, the first word line WL1 and the first string selection line SSL1 are selected. The ground selection lines GSL1 through GSL3 may be commonly connected to each other.

Figure 4:
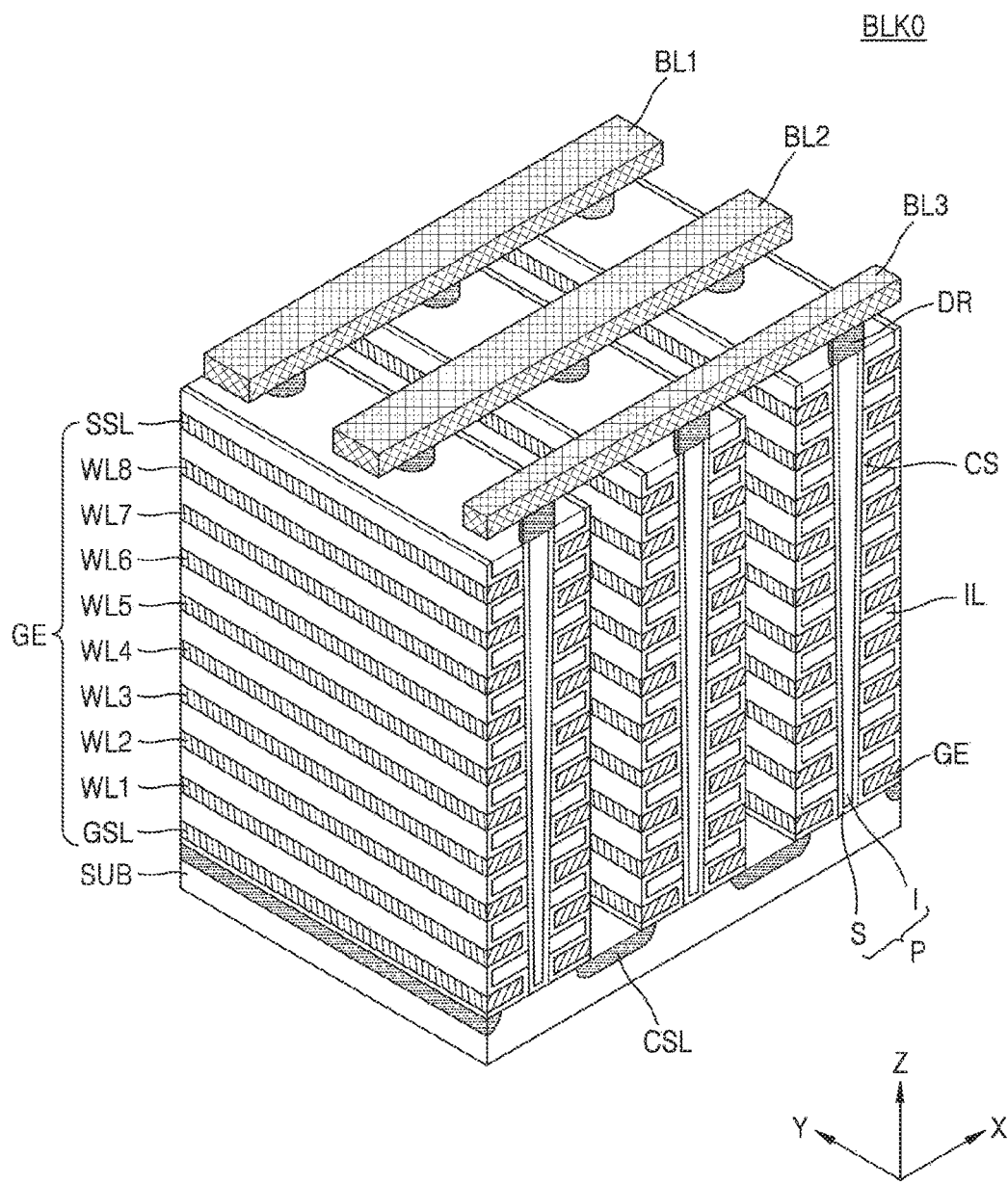
FIG. 4 illustrates a perspective view of the memory block BLK0 of FIG. 3.

FIG. 4 illustrates a perspective view of the memory block BLK0 of FIG. 3.

Referring to FIG. 4, each memory block included in, e.g., the memory cell array 100 (of FIG. 1) may be formed in a direction perpendicular to a substrate SUB. Although FIG. 4 shows that a memory block includes two of the selection lines GSL and SSL, eight of the word lines WL1 through WL8, and three of the bit lines BL1 through BL3, the number of selection lines, word lines and bit lines may be more or less in various example embodiments of the inventive concept.

The substrate SUB has a first conductivity type (e.g., a p-type) and extends in a first direction (e.g., a Y-direction), and the common source line CSL doped with impurities of a second conductivity type (e.g., an n-type) may be provided. A plurality of insulating layers IL extending along the first direction are sequentially provided along a third direction (e.g., a Z-direction) on a region of the substrate SUB between two adjacent common source lines CSL, and the plurality of insulating layers IL may be spaced apart from each other by a specific distance along the third direction. For example, the plurality of insulating layers IL may include an insulating material such as silicon oxide.

A plurality of pillars P arranged sequentially along the first direction and passing through the plurality of insulating layers IL along the third direction may be provided on the region of the substrate SUB between the two adjacent common source lines CSL. For example, the plurality of pillars P may penetrate the plurality of insulating layers IL and contact the substrate SUB. In more detail, a surface layer S of each pillar P may include a first type of silicon material and may function as a channel region. An inner layer I of each pillar P may include an insulating material such as silicon oxide or an air gap.

In the region of the substrate SUB between the two adjacent common source lines CSL, a charge storage layer CS is provided along exposed surfaces of the insulating layers IL, the pillars P, and the substrate SUB. The charge storage layer CS may include a gate insulating layer (referred to as a tunneling insulating layer), a charge trap layer, and a blocking insulating layer. For example, the charge storage layer CS may have an oxide-nitride-oxide (ONO) structure. In addition, in the region between the two adjacent common source lines CSL, a gate electrode GE such as the selection lines GSL and SSL and the word lines WL1 through WL8 may be formed on an exposed surface of the charge storage layer CS.

Drains or drain contacts DR may be provided on the plurality of pillars P, respectively. For example, the drains or drain contacts DR may include a silicon material doped with impurities of a second conductivity type. The bit lines BL1 through BL3 extending in a second direction (e.g., an X-direction) and spaced apart by a certain distance along the first direction are provided on the drains DR.

Figure 5:
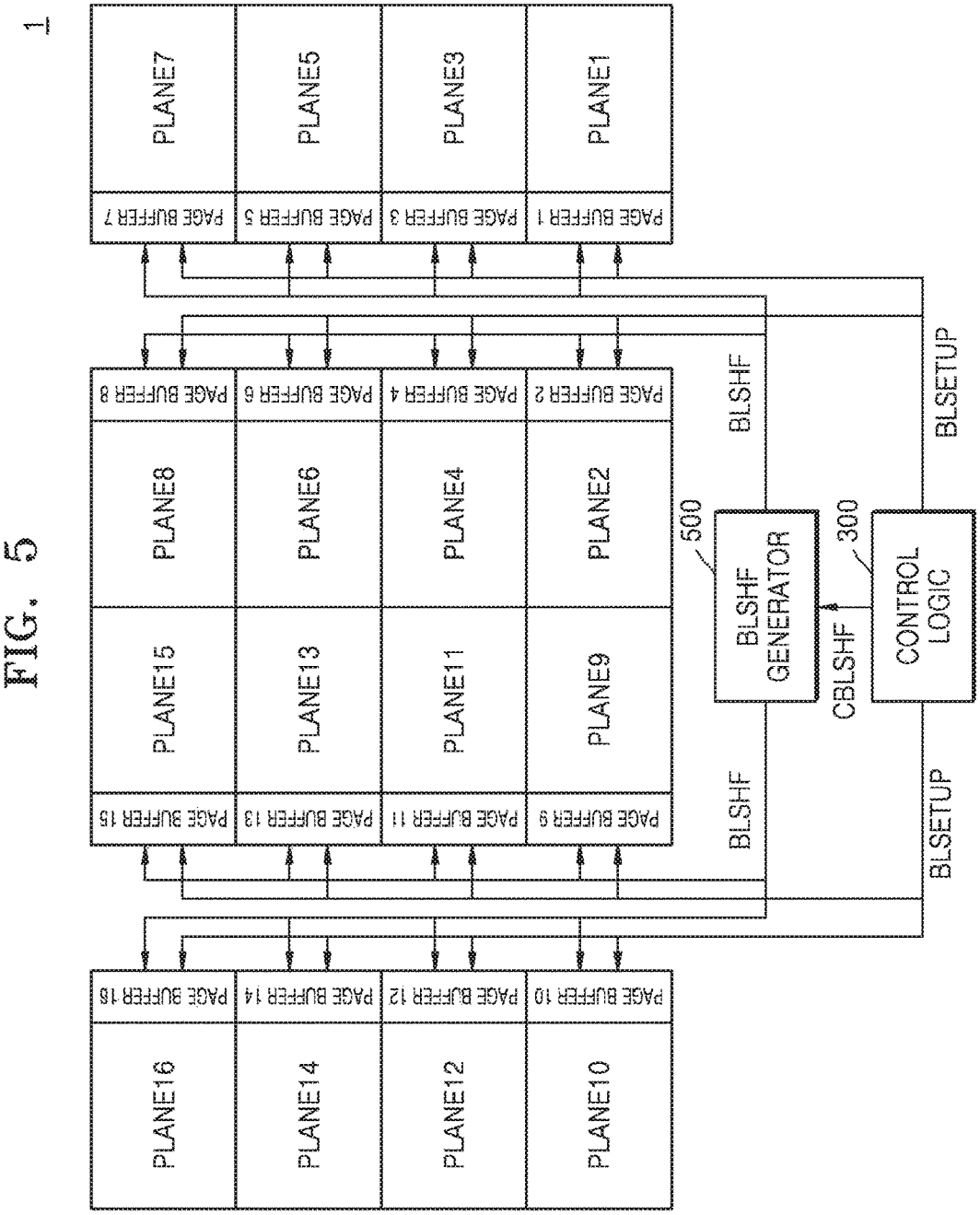
FIG. 5 illustrates a block diagram of a nonvolatile memory device according to example embodiments of the inventive concept.

FIG. 5 illustrates a block diagram of the nonvolatile memory device 1 according to example embodiments of the inventive concept. While FIG. 1 is a block diagram simultaneously illustrating various configurations connected to the nonvolatile memory device 1, FIG. 5 illustrates a connection relationship between a plurality of planes constituting the memory cell array 100 of FIG. 1, the page buffer 200 (that is, Page Buffer1 through Page Buffer16), the control logic circuit 300 and the bit line shutoff signal generator 500. In FIG. 5, like reference numerals to those in FIG. 1 denote like elements, and therefore, repeated descriptions thereof will not be given herein.

Referring to FIGS. 1 and 5, the memory cell array 100 may include a plurality of planes Plane1 through Plane16. Although FIG. 5 shows that the plurality of planes Plane1 through Plane16 include 16 planes, the inventive concept is not limited thereto. For example, each of the plurality of planes Plane1 through Plane16 may include, but are not limited to, an odd plane and an even plane.

The page buffer 200 may include a plurality of page buffers Page Buffer1 through Page Buffer16. The plurality of page buffers Page Buffer1 through Page Buffer16 may be arranged to correspond to the plurality of planes Plane1 through Plane16, and may be connected to the plurality of planes Plane1 through Plane16, respectively. The plurality of planes Plane1 through Plane16 and the plurality of page buffers Page Buffer1 through Page Buffer16 arranged to correspond to the plurality of planes Plane1 through Plane16 may form first through 16th plane groups, respectively.

Figure 16:
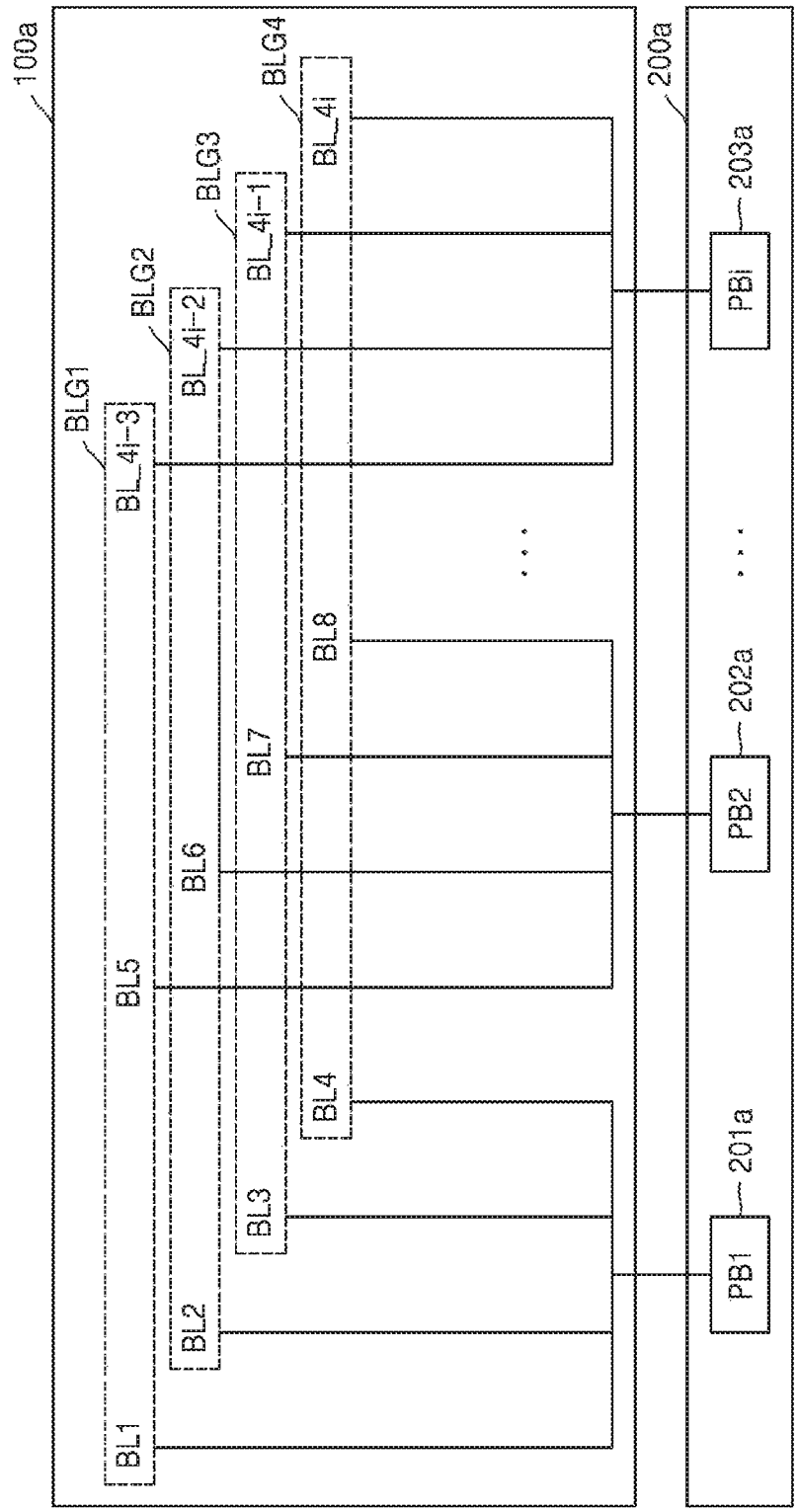
FIG. 16 illustrates a diagram of a memory device including a page buffer of a Quadruple Bit Line (QBL) structure, according to example embodiments of the inventive concept.
Figure 17:
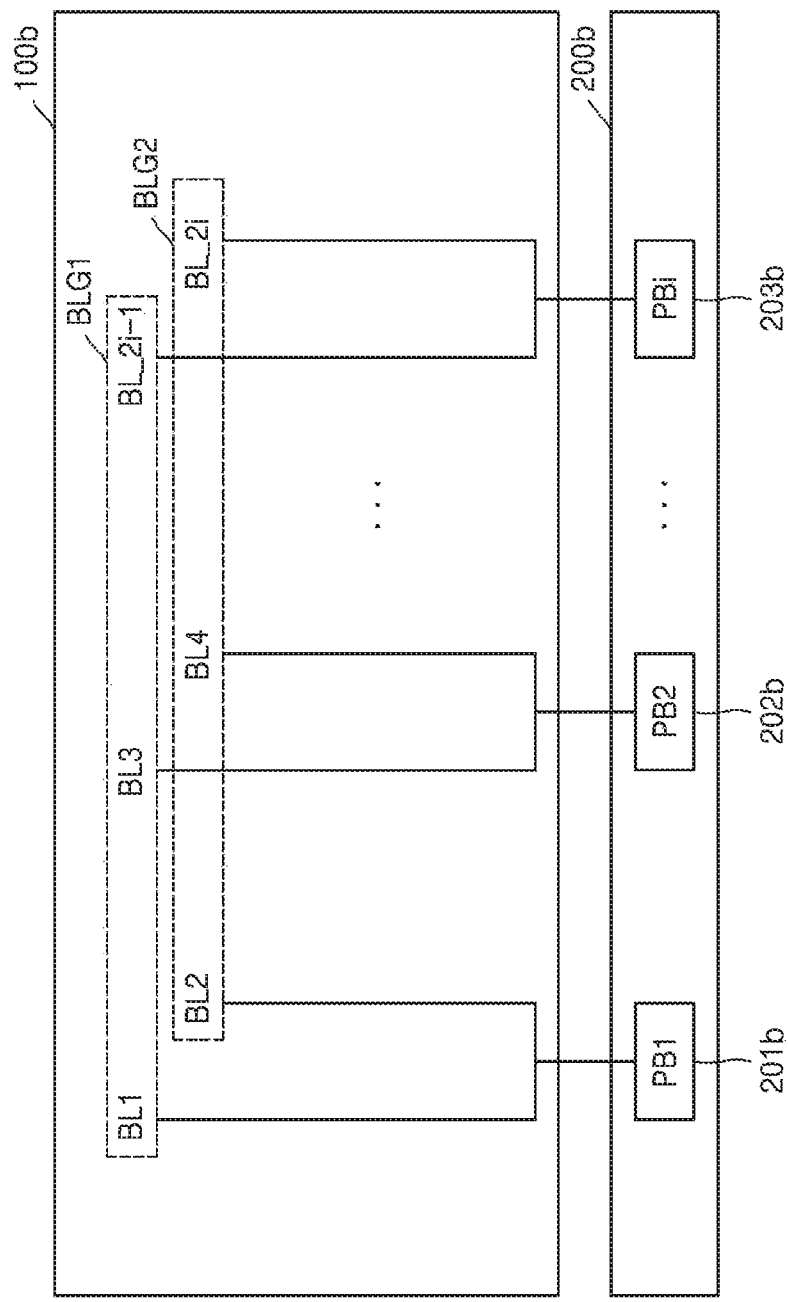
FIG. 17 illustrates a view of a memory device including a page buffer of a Shielded Bit Line (SBL) structure, according to example embodiments of the inventive concept.
Figure 18:
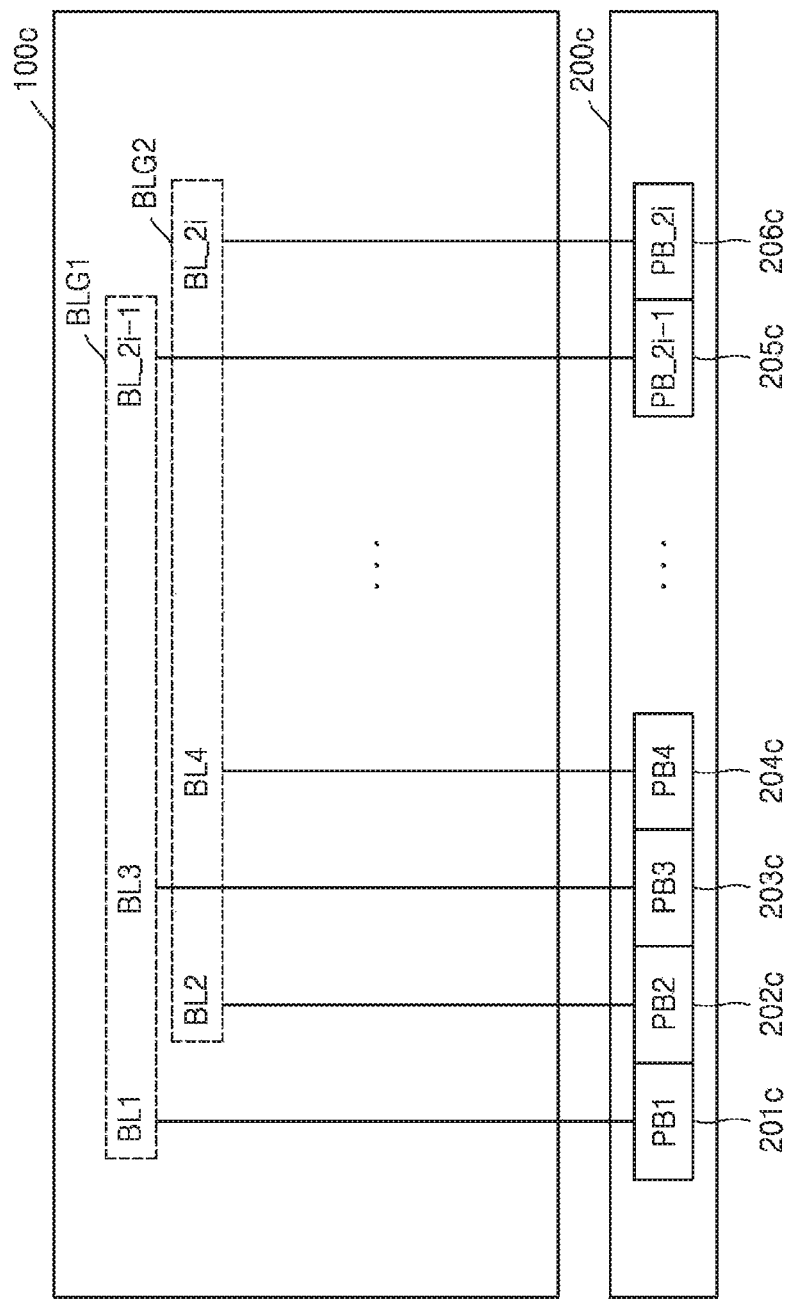
FIG. 18 illustrates a view of a memory device including a page buffer of an All Bit Line (ABL) structure, according to example embodiments of the inventive concept.

As shown in FIGS. 16 to 18 and as will be later described in more detail, each of the plurality of page buffers Page Buffer1 through Page Buffer16 may include a plurality of page buffers, and may be configured to perform a read operation for each bit line group included in each of the plurality of planes Plane1 through Plane16, thereby reducing interference between bit lines. However, example embodiments of the inventive concept are not limited to configurations as described with respect to FIGS. 16-18.

The control logic circuit 300 may transmit the bit line setup signal BLSETUP to each of the plurality of page buffers Page Buffer1 through Page Buffer16 to read data stored in each of the plurality of planes Plane1 through Plane16, and may transmit the shutoff signal control signal CBLSHF to the bit line shutoff signal generator 500. The bit line shutoff signal generator 500 may transmit the bit line shutoff signal BLSHF to each of the plurality of page buffers Page Buffer1 through Page Buffer16 based on the shutoff signal control signal CBLSHF.

The control logic circuit 300 may read only data stored in one of the plurality of planes Plane1 through Plane16, or may simultaneously read data stored in at least two of the plurality of planes Plane1 through Plane16.

As the number of planes simultaneously performing a data read operation increases, a degree of a change in a level of the bit line shutoff signal BLSHF transmitted to each of page buffers corresponding to the planes performing the data read operation may change, that is, a gradient may be changed and a length of a precharge section may be changed. A detailed description will be provided later below with reference to FIG. 13.

In example embodiments as illustrated in FIG. 5, the first plane group may be physically relatively close (i.e., in relatively close proximity positionally) to the bit line shutoff signal generator 500, while the 16th plane group may be physically relatively far away (i.e., not in relatively close proximity positionally) from the control logic circuit 300. Depending on a difference in a physical distance from the bit line shutoff signal generator 500, a degree of a change in a level of bit line shutoff signal BLSHF transmitted to each of page buffers, that is, a gradient may be changed and a length of a precharge section may be changed. A detailed description will be provided later below with reference to FIG. 13.

Figure 6:
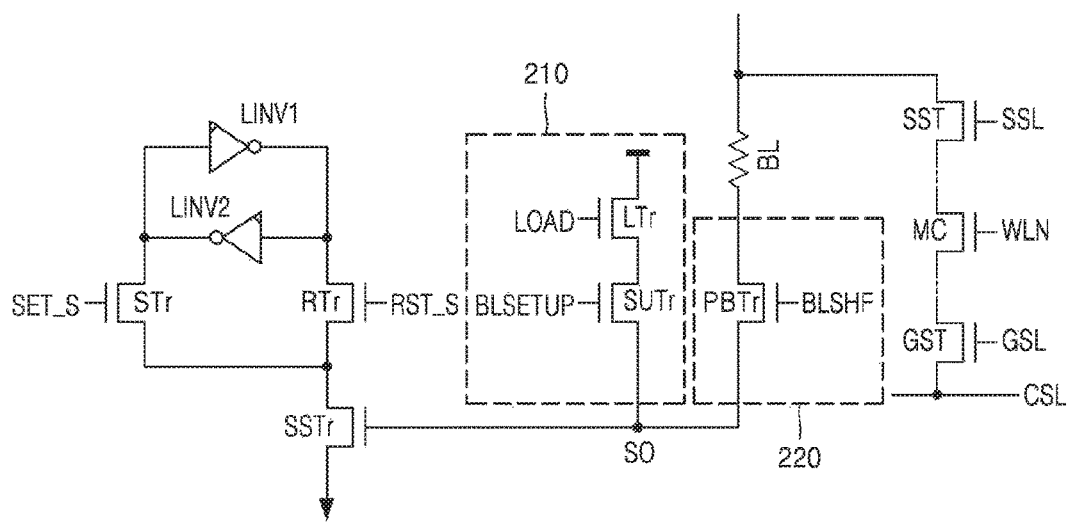
FIG. 6 illustrates a circuit diagram of a portion of a nonvolatile memory device according to example embodiments of the inventive concept.

FIG. 6 illustrates a circuit diagram of a portion of a nonvolatile memory device according to example embodiments of the inventive concept, including a portion of the page buffer 200 and a portion of the memory cell array 100 of FIG. 1.

Referring to FIG. 6, the page buffer 200 of FIG. 1 includes a plurality of page buffers, and each of the plurality of page buffers includes the precharge circuit 210 and the shutoff circuit 220. The precharge circuit 210 may include a load transistor LTr and a setup transistor SUTr, and the shutoff circuit 220 may include a page buffer transistor PBTr. In addition, each of the plurality of page buffers may include a sensing latch including a set transistor STr, a reset transistor RTr, a sensing transistor SSTr, and first and second latch inverters LINV1 and LINV2.

The memory cell array 100 includes the string selection transistor SST, the plurality of memory cells MC, the ground selection transistor GST, and a bit line BL. Since the string selection transistor SST, the plurality of memory cells MC, and the ground selection transistor GST are described above with reference to FIG. 2 and the like, detailed descriptions thereof will not be given herein. The bit line BL is shown as equivalent resistance due to self-resistance of a conductor wire or the like.

General sensing of the memory cell MC in the nonvolatile memory device 1 may include an initialization operation, a precharge operation, a bit line developing operation, an offset developing operation, and a sensing operation. The bit line developing operation and the offset developing operation may be performed simultaneously.

In the initialization operation, a set signal SET_S transitions to logic high so that the set transistor STr is turned ON, whereby the sensing latch may be initialized.

In the precharge operation, the load transistor LTr and the setup transistor SUTr of the precharge circuit 210 may be turned ON. A load signal LOAD and the bit line setup signal BLSETUP may transition to 0V or a ground voltage level V_SS in order that the load transistor LTr and the setup transistor SUTr are turned on. Then, a sensing node SO may be charged to a predetermined voltage level. Furthermore, a voltage level of the bit line shutoff signal BLSHF transitions to the precharge voltage V_PRE so that the bit line BL connected to the sensing node SO may be charged to a predetermined voltage level. The precharge operation is performed until the bit line setup signal BLSETUP transitions to a high level and the setup transistor SUTr is turned off.

In the developing operation, the setup transistor SUTr is turned OFF, that is, the bit line setup signal BLSETUP transitions to a power supply voltage level VDD to terminate the precharge operation for the bit line BL. The bit line shutoff signal BLSHF may transition to the developing voltage V_DEV that is lower than the precharge voltage V_PRE and higher than a ground voltage. Depending on whether a selected memory cell is turned on or off, charges charged in the bit line BL may be discharged to the common source line CSL or maintained. Therefore, when the memory cell MC is in an ON state, a voltage level of the bit line BL may be lower than when the memory cell MC is in an OFF state.

The shutoff circuit 220 may include only one transistor, and the transistor may be the page buffer transistor PBTr. Since the precharge operation and the developing operation are controlled through one transistor, a mismatch between transistors may be minimized as compared to a case where the precharge operation and the developing operation are separately controlled using a plurality of transistors.

A reset transistor signal RST_S transitions to an ON state in the sensing operation, and the memory cell MC may be sensed as an ON or OFF state depending on whether the sensing latch flips.

Figure 7:
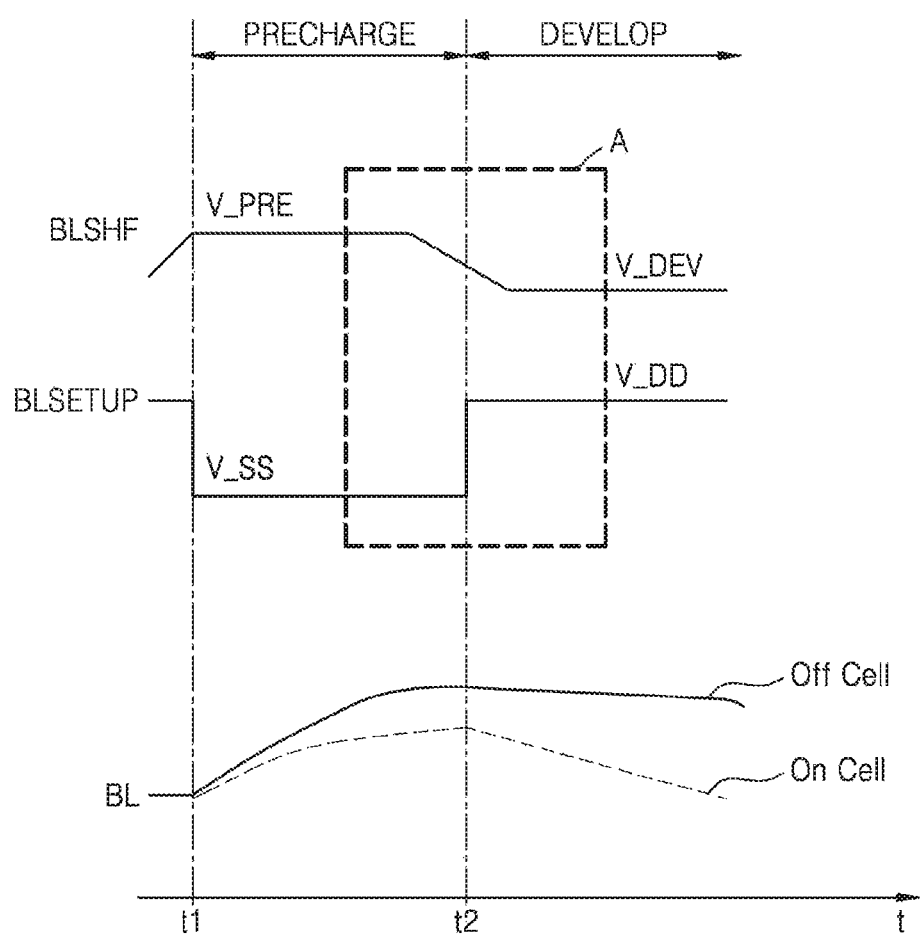
FIG. 7 illustrates a timing diagram of a precharge operation and a developing operation in a read operation according to example embodiments of the inventive concept.

FIG. 7 illustrates a timing diagram of a precharge operation and a developing operation in a read operation according to example embodiments of the inventive concept. FIG. 7 shows a case where a bit line developing operation and an offset developing operation are performed simultaneously.

Referring to FIGS. 6 and 7, at t1, the bit line setup signal BLSETUP may transition to logic low V_SS (for example, to the ground voltage level V_SS) and the bit line shutoff signal BLSHF may transition to the precharge voltage V_PRE to provide a voltage to the bit line BL. As the precharge operation progresses, a voltage level of the bit line BL may gradually increase. However, the voltage level of the bit line BL increases more when the memory cell MC is in an OFF state than when the memory cell MC is in an ON state. Therefore, as the precharge operation progresses, a difference between a voltage level of the bit line BL when the memory cell MC is in an ON state and a voltage level of the bit line BL when the memory cell MC is in an OFF state may be gradually increased.

At t2, the bit line setup signal BLSETUP may transition to logic high. For example, the bit line setup signal BLSETUP may transition to the power supply voltage level VDD. The bit line shutoff signal BLSHF may transition from the precharge voltage V_PRE to the developing voltage V_DEV with a predetermined gradient before and after t2. The gradient may vary depending on a time taken to transition from the precharge voltage V_PRE to the developing voltage V_DEV, a level of the precharge voltage V_PRE, and a level of the developing voltage V_DEV.

As a developing operation progresses, a voltage level of the bit line BL may gradually decrease. However, a voltage level of the bit line BL abruptly decreases when the memory cell MC is in an ON state and is kept substantially constant when the memory cell MC is in an OFF state.

During the development operation, the bit line shutoff signal BLSHF is lower in level than the precharge voltage V_PRE but has the voltage V_DEV higher than a ground voltage, so that the page buffer transistor PBTr may be turned on. For example, the precharge voltage V_PRE may be about 1.7V and the developing voltage V_DEV may be about 1.5V. In another example, the precharge voltage V_PRE may be about 1.8V and the developing voltage V_DEV may be about 1.4V. Therefore, a result of development of the bit line BL may be reflected to the sensing node SO. That is, since the bit line developing operation and the offset developing operation are performed at the same time during the developing operation (i.e., the bit line BL and the sensing node SO are developed simultaneously), a voltage level of the sensing node SO may be changed in a manner similar to that of the bit line shutoff signal BLSHF.

In the sensing operation, it is possible to sense whether the memory cell MC is in an ON state or in an OFF state based on a voltage level of the sensing node SO. Therefore, the greater a difference between a voltage level of the sensing node SO when the memory cell MC is in an ON state and a voltage level of the sensing node SO when the memory cell MC is in an OFF state, the more efficiently a state of the memory cell MC may be sensed.

Furthermore, since a nonvolatile memory device according to embodiments of the inventive concept performs a read operation in which the bit line shutoff signal BLSHF transitions from the precharge voltage V_PRE to the developing voltage V_DEV, without being shifted to the developing voltage V_DEV after transitioning from the precharge voltage V_PRE to a ground voltage, the bit line developing operation and the offset developing operation are performed simultaneously. Therefore, time taken to sense data is reduced and the data may be read at high speed.

Figure 8A:
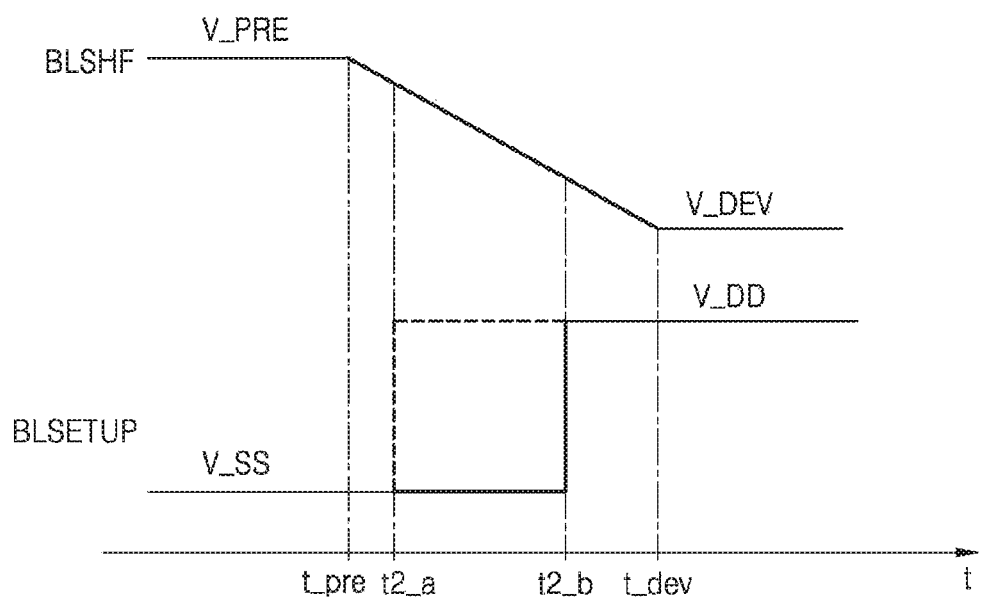
FIG. 8A illustrates a timing diagram of a part of a precharge operation and a part of a developing operation in a read operation, according to example embodiments of the inventive concept.
Figure 8B:
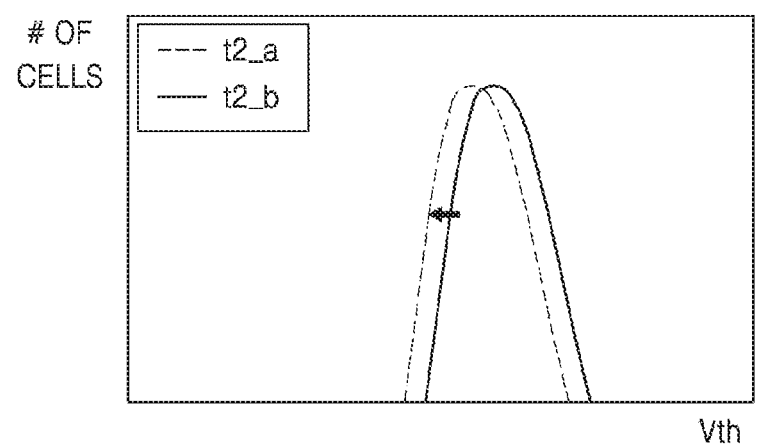
FIG. 8B illustrates a diagram of threshold voltage distribution of a memory cell according to a point in time when a level of a bit line setup signal BLSETUP is changed.

FIG. 8A illustrates a timing diagram of a part of a precharge operation and a part of a developing operation in a read operation, according to example embodiments of the inventive concept, including portion A of FIG. 7 enlarged. FIG. 8B illustrates a diagram of threshold voltage distribution of a memory cell according to a point in time when a level of the bit line setup signal BLSETUP is changed. FIG. 8B shows that the level of the bit line setup signal BLSETUP is changed at a first transition time t2_a and a second transition time t2_b in FIG. 8A.

Referring to FIGS. 8A and 8B, the bit line shutoff signal BLSHF may transition from the precharge voltage V_PRE to the developing voltage V_DEV with a predetermined gradient for a predetermined time t_pre-t_dev.

When the bit line setup signal BLSETUP transitions from logic low V_SS to logic high V_DD at the first transition time t2_a as indicated by the dashed line, the precharge interval becomes relatively short as compared to a case where the bit line setup signal BLSETUP transitions from logic low V_SS to the logic high V_DD at the second transition time t2_b as indicated by the solid line. The bit line BL may not be sufficiently precharged when the bit line setup signal BLSETUP transitions at the first transition time t2_a to the logic high V_DD. In particular, if the bit line BL is not sufficiently precharged when the memory cell MC is in an OFF state, a level of the bit line BL voltage becomes lower than when the bit line BL is sufficiently precharged. Thus, the memory cell MC may be sensed as if a state of the memory cell MC is in an ON state. That is, distribution of a threshold voltage of the memory cell MC is sensed in a form shifting in a negative direction as a whole, so that accuracy of sensing may not be guaranteed.

Therefore, it may be important to perform a bit line developing operation and an offset developing operation at the same time to enable a high-speed read operation, and to adjust a point in time for changing a level of the bit line setup signal BLSETUP to sufficiently ensure a precharge operation while the bit line shutoff signal BLSHF transitions from the precharge voltage V_PRE to the developing voltage V_DEV.

The nonvolatile memory device 1 of FIG. 1 according to example embodiments of the inventive concept may adjust a point in time for changing a level of the bit line setup signal BLSETUP based on a gradient at which the bit line shutoff signal BLSHF transitions from the precharge voltage V_PRE to the developing voltage V_DEV. Accordingly, the nonvolatile memory device 1 may perform a high-speed read operation and sufficiently secure a precharge operation, and thus accuracy of sensing may be guaranteed. A detailed description will be provided later below.

Figure 9:
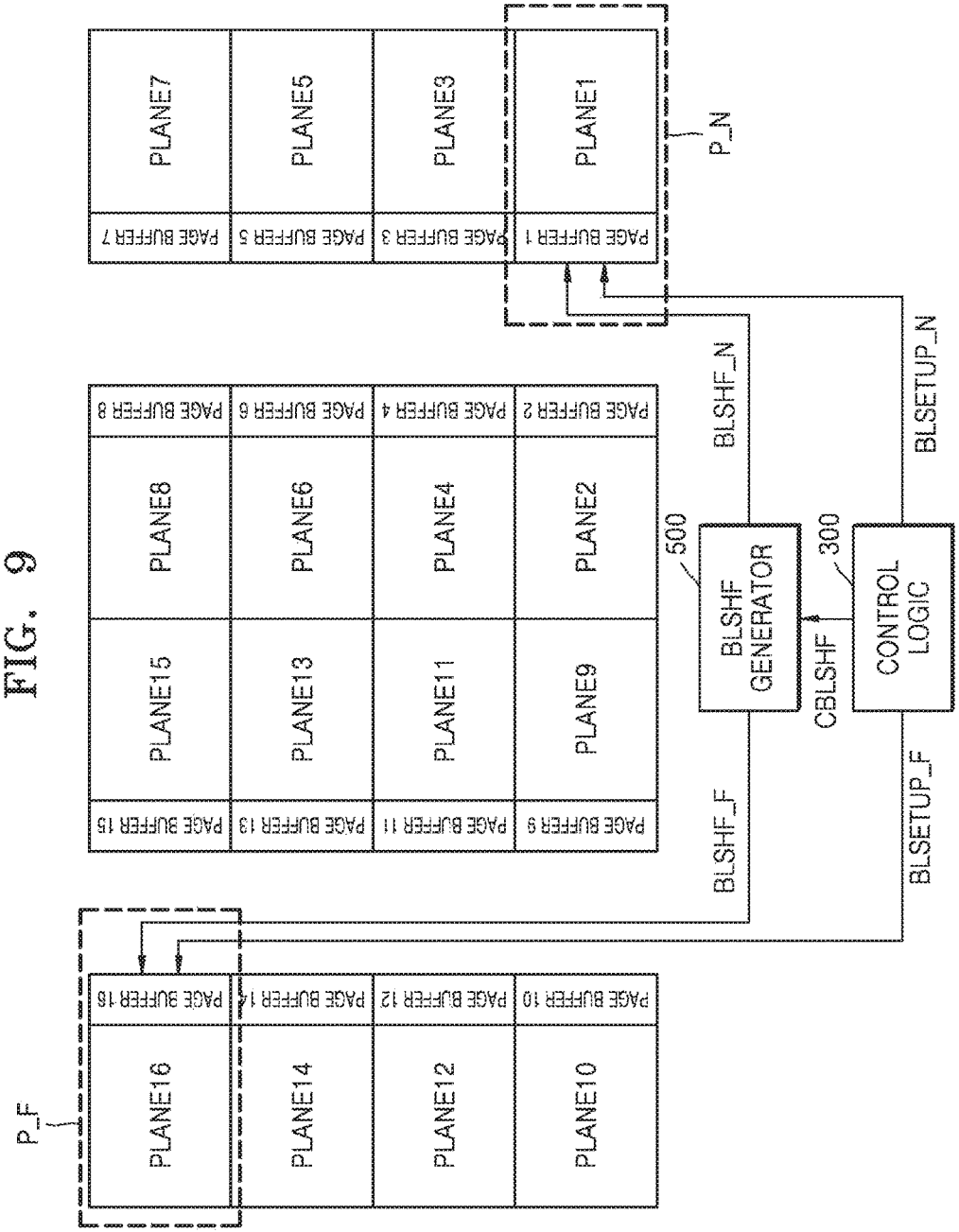
FIG. 9 illustrates a block diagram of a nonvolatile memory device according to example embodiments of the inventive concept.
Figures 10, 11:
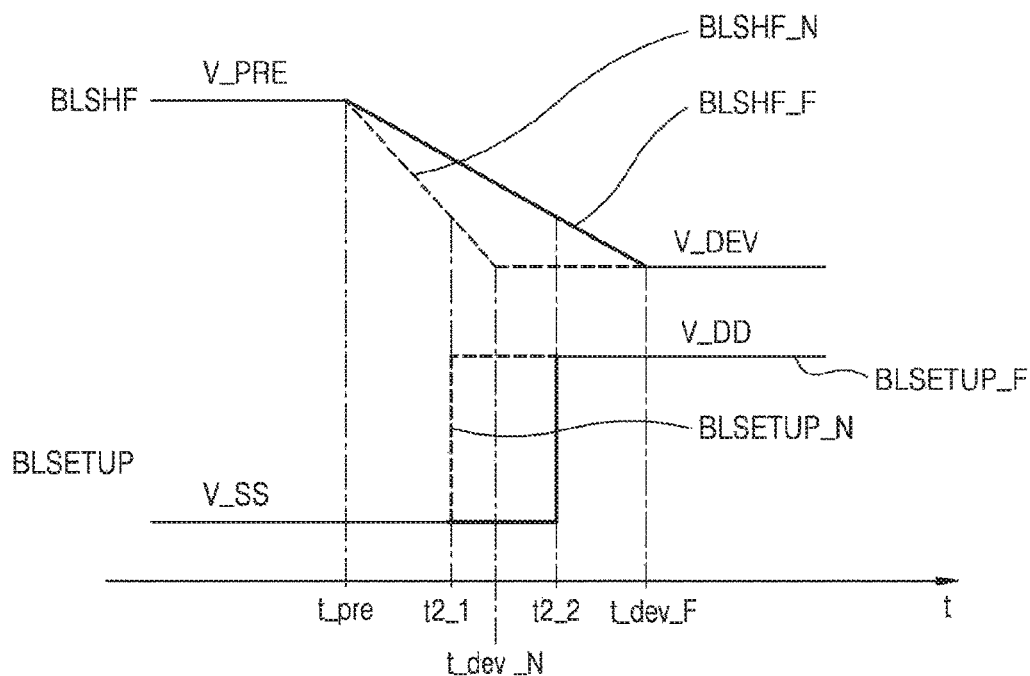
FIG. 10 illustrates a timing diagram of a part of a precharge operation and a part of a developing operation in a read operation, according to example embodiments of the inventive concept.
FIG. 11 illustrates a table for explaining an interval value of a bit line setup signal in a nonvolatile memory device, according to example embodiments of the inventive concept.

FIG. 9 illustrates a block diagram of a nonvolatile memory device according to example embodiments of the inventive concept. In FIG. 9, like reference numerals to those in FIGS. 1 and 5 denote like elements, and therefore, repeated descriptions thereof will not be given herein. FIG. 10 illustrates a timing diagram of a part of a precharge operation and a part of a developing operation in a read operation, according to example embodiments of the inventive concept.

Referring to FIGS. 9 and 10, the nonvolatile memory device may include the plurality of planes Plane1 through Plane16, the plurality of page buffers Page Buffer1 through Page Buffer16, the control logic circuit 300, and the bit line shutoff signal generator 500. The plurality of page buffers Page Buffer1 through Page Buffer16 may be arranged to correspond to the plurality of planes Plane1 through Plane16, and may be connected to the plurality of planes Plane1 through Plane16, respectively.

The control logic circuit 300 may transmit the bit line setup signal BLSETUP to each of the plurality of page buffers Page Buffer1 through Page Buffer16 to read data stored in each of the plurality of planes Plane1 through Plane16, and may transmit the shutoff signal control signal CBLSHF to the bit line shutoff signal generator 500. The bit line shutoff signal generator 500 may transmit the bit line shutoff signal BLSHF to each of the plurality of page buffers Page Buffer1 through Page Buffer16 based on the shutoff signal control signal CBLSHF.

Depending on a distance that the bit line shutoff signal BLSHF is transmitted from the bit line shutoff signal generator 500 to each of the plurality of page buffers Page Buffer1 through Page Buffer16, respective gradients of transition from the precharge voltage V_PRE to the developing voltage V_DEV of the bit line shutoff signal BLSHF received by the plurality of page buffers Page Buffer1 through Page Buffer16 may be different from each other.

For example, the first page buffer Page Buffer1 and the first plane Plane1 are physically relatively close to the bit line shutoff signal generator 500, and may be classified as a near plane group P_N. On the other hand, the 16th page buffer Page Buffer16 and the 16th plane Plane16 are physically relatively far away from the bit line shutoff signal generator 500, and may be classified as a far plane group P_F.

The far plane group P_F is physically far away from the bit line shutoff signal generator 500 as compared to the near plane group P_N. The greater a distance the bit line shutoff signal BLSHF is transmitted from the bit line shutoff signal generator 500 to a page buffer, the larger a loading effect may occur. Therefore, a bit line shutoff signal BLSHF_F transmitted to the far plane group P_F may transition from the precharge voltage V_PRE to the developing voltage V_DEV with a gentle gradient, as compared to a bit line shutoff signal BLSHF_N transmitted to the near plane group P_N which transitions with a steeper gradient.

Due to a difference in gradients of the bit line shutoff signals BLSHF_F and BLSHF_N respectively transmitted to the far plane group P_F and the near plane group P_N, transition times at which the bit line setup signals BLSETUP transition from the logic low V_SS to the logic high V_DD may be different from each other. A bit line setup signal BLSETUP_N transmitted to the near plane group P_N may transition from the logic low V_SS to the logic high V_DD at a first transition time t2_1. Meanwhile, a bit line setup signal BLSETUP_F transmitted to the far plane group P_F may transition from the logic low V_SS to the logic high V_DD at a second transition time t2_2, which is later than the first transition time t2_1. Therefore, the near plane group P_N may perform data sensing at a high speed and the far plane group P_F may obtain sufficient precharge time, thereby enabling accurate data sensing.

According to FIG. 10, the first transition time t2_1 and the second transition time t2_2 are at points in time when the bit line shutoff signal BLSHF is constantly reduced (i.e., between times t_pre and t_dev_N for the bit line shutoff signal BLSHF_N, and between times t_pre and t_dev_F for the bit line shutoff signal BLSHF_F) for the near plane group P_N and the far plane group P_F. However, embodiments of the inventive concept are not limited as here described. In other example embodiments, a transition time when the bit line setup signal BLSETUP transitions from the logic low V_SS to the logic high V_DD may refer to or correspond to a moment when the bit line shutoff signal BLSHF has a value of the developing voltage V_DEV.

A gradient at which the bit line shutoff signal BLSHF transitions from the precharge voltage V_PRE to the developing voltage V_DEV may vary depending on magnitudes of the precharge voltage V_PRE and the developing voltage V_DEV. Therefore, the first transition time t2_1 of the near plane group P_N and the second transition time t2_2 of the far plane group P_F may vary depending on magnitudes of the precharge voltage V_PRE and the developing voltage V_DEV.

FIG. 11 illustrates a table for explaining an interval value of a bit line setup signal in a nonvolatile memory device, according to example embodiments of the inventive concept.

Referring to FIGS. 5 and 11, the first through 16th plane groups may be classified according to a distance in which the bit line shutoff signal BLSHF is transmitted from the bit line shutoff signal generator 500 to each of the first through 16th plane groups. For example, the first, second, ninth, and tenth plane groups may be classified into a first near plane group, and the third, fourth, eleventh, and twelfth plane groups may be classified into a second near plane group. The fifth, sixth, thirteenth, and fourteenth plane groups may be classified into a first far plane group, and the seventh, eighth, fifteenth, and sixteenth plane groups may be classified into a second far plane group. The transmission distances by which the bit line shutoff signal BLSHF is transmitted from the bit line shutoff signal generator 500 respectively to the first near plane group, the second near plane group, the first far plane group, and the second far plane group increases. That is, the transmission distance of the bit line shutoff signal BLSHF between the bit line shutoff signal generator 500 and the second far plane group is greater than the transmission distance between the bit line shutoff signal generator 500 and the first far plane group. The transmission distance between the bit line shutoff generator 500 and the first far plane group is greater than the transmission distance between the bit line shutoff generator 500 and the second near plane group. The transmission distance between the bit line shutoff generator 500 and the second near plane group is greater than the transmission distance between the bit line shutoff generator 500 and the first near plane group.

Information corresponding to and identifying a set (i.e., predetermined) transition time of a bit line setup signal BLSETUP corresponding to each of the first near plane group, the second near plane group, the first far plane group, and the second far plane group classified based on the transmission distance may be stored in the control logic circuit 300. The transition time may refer to a point in time when the bit line setup signal BLSETUP transitions from the logic low V_SS to the logic high V_DD. The information corresponding to the transition time may refer to, for example, an interval value of time from a point in time when the bit line shutoff signal BLSHF starts to decrease at a first level (i.e., a point in time when a gradient starts, t_pre of FIG. 10) to the transition time, but is not limited thereto. The information may be an interval value from another specific time to the transition time.

An interval of the bit line setup signal BLSETUP corresponding to each of the first near plane group, the second near plane group, the first far plane group, and the second far plane group may respectively be a first interval value t2_A, a second interval value t2_B, a third interval value t2_C, and a fourth interval value t2_D. The interval may increase from the first interval value t2_A, the second interval value t2_B, the third interval value t2_C, toward the fourth interval value t2_D. That is, the second interval value t2_B may be greater than the first interval value t2_A, the third interval value t2_C may be greater than the second interval value t2_B, and the fourth interval value t2_D may be greater than the third interval value t2_C.

When the control logic circuit 300 performs a read operation on any of the first through 16th plane groups, the control logic circuit 300 controls the bit line setup signal BLSETUP transmitted to the corresponding first through 16th plane groups based on the information corresponding to the transition time. The control logic circuit 300 is configured to delay the transition time of the bit line setup signal BLSETUP by the corresponding interval value according to a transmission distance by which the bit line shutoff signal is transmitted between the bit line shutoff signal generator 500 and the page buffer of a plane selected for a read operation. The interval value selected is greater, and consequently the corresponding delay is increased, as the transmission distance is increased.

Figure 12:
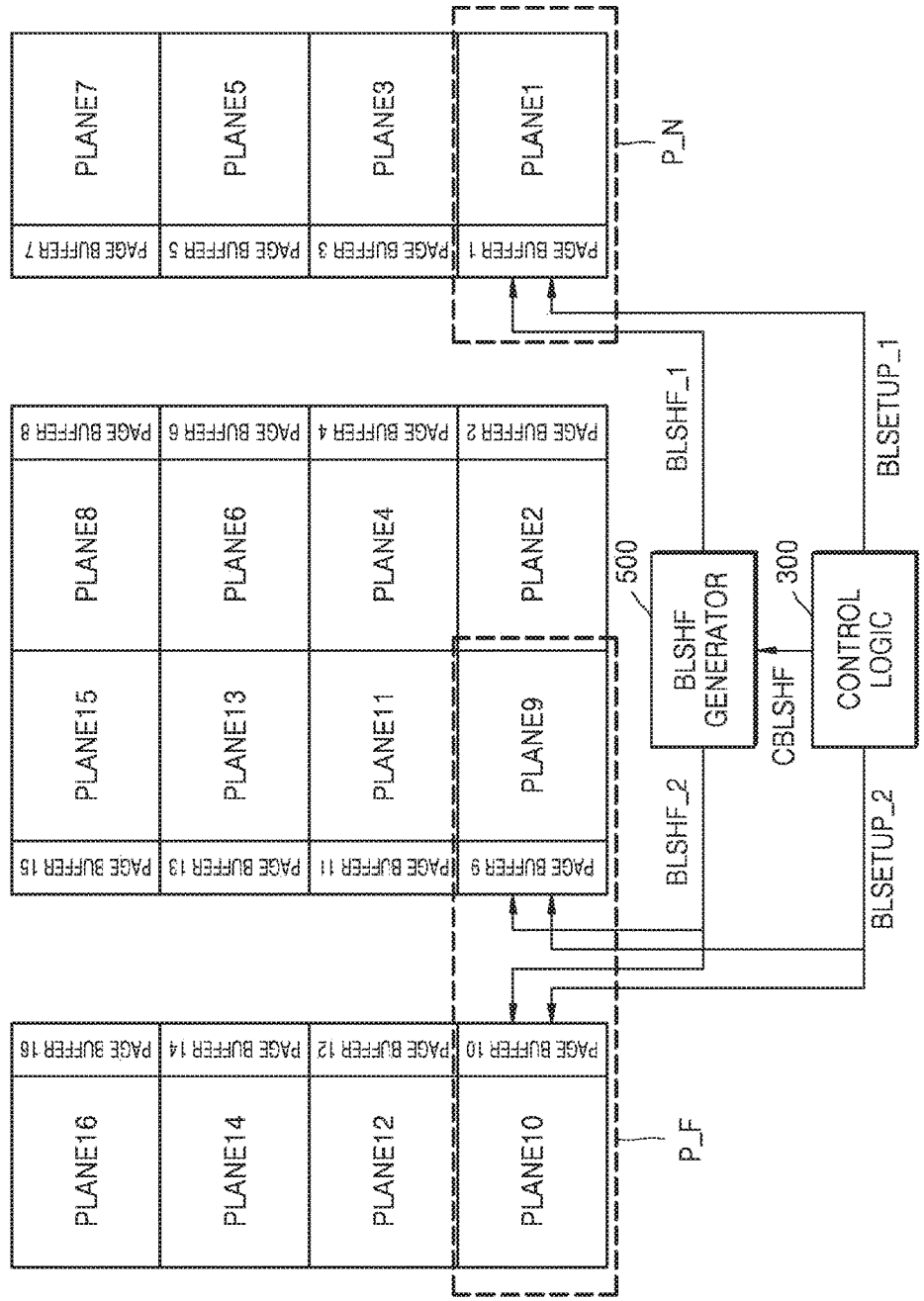
FIG. 12 illustrates a block diagram of a nonvolatile memory device according to example embodiments of the inventive concept.
Figure 13:
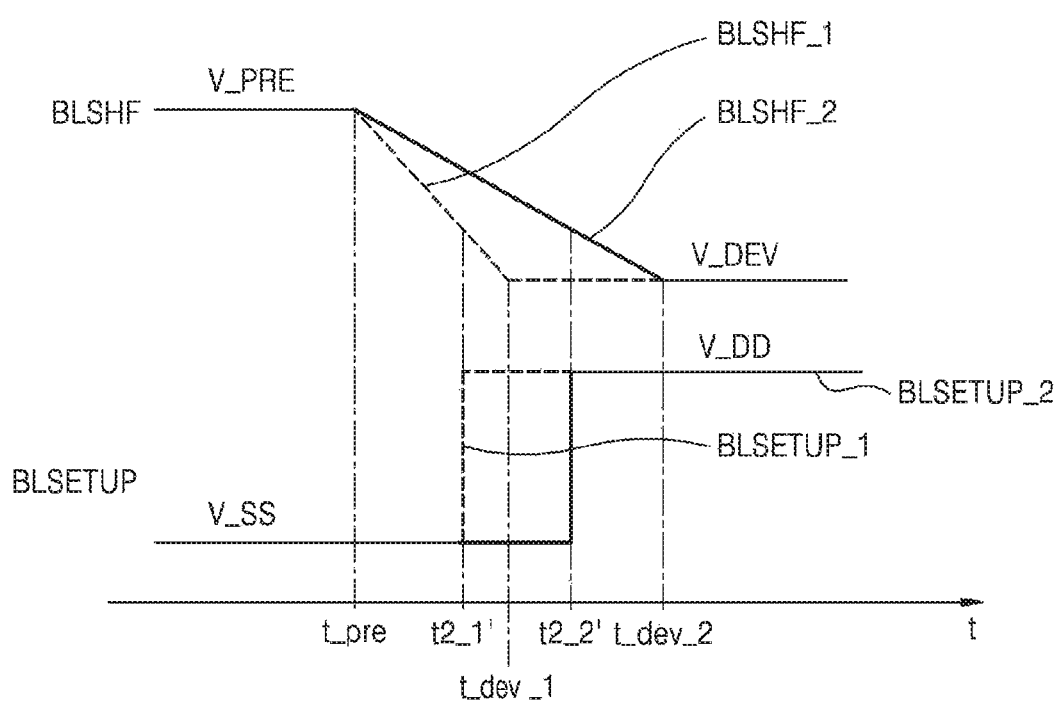
FIG. 13 illustrates a timing diagram of a part of a precharge operation and a part of a developing operation in a read operation, according to example embodiments of the inventive concept.

FIG. 12 illustrates a block diagram of a nonvolatile memory device according to example embodiments of the inventive concept. In FIG. 12, like reference numerals to those in FIGS. 1 and 5 denote like elements, and therefore, repeated descriptions thereof will not be given herein. FIG. 13 illustrates a timing diagram of a part of a precharge operation and a part of a developing operation in a read operation, according to example embodiments of the inventive concept.

Referring to FIGS. 12 and 13, the nonvolatile memory device includes the plurality of planes Plane1 through Plane16, the plurality of page buffers Page Buffer1 through Page Buffer16, the control logic circuit 300, and the bit line shutoff signal generator 500. The plurality of page buffers Page Buffer1 through Page Buffer16 may be arranged to correspond to the plurality of planes Plane1 through Plane16 and may be connected to the plurality of planes Plane1 through Plane16, respectively.

The control logic circuit 300 may transmit the bit line setup signal BLSETUP to each of the plurality of page buffers Page Buffer1 through Page Buffer16 to read data stored in each of the plurality of planes Plane1 through Plane16, and may transmit the shutoff signal control signal CBLSHF to the bit line shutoff signal generator 500. The bit line shutoff signal generator 500 may transmit the bit line shutoff signal BLSHF to each of the plurality of page buffers Page Buffer1 through Page Buffer16 based on the shutoff signal control signal CBLSHF.

Depending on the number of plane groups selected to perform a read operation, gradients of the bit line shutoff signal BLSHF which is received by the selected plane groups and which transitions from the precharge voltage V_PRE to the development voltage V_DEV, may be different from each other.

For example, as shown in FIG. 12, only the first plane group (which hereinafter may be referred to as one plane group P_1) may be selected, or the ninth and tenth plane groups (which hereinafter may be referred to as two plane groups P_2) may be selected at the same time to perform a read operation. When the bit line shutoff signal BLSHF is transmitted from the bit line shutoff signal generator 500 to each plane group, a load effect may be greater when two plane groups P_2 are selected at the same time, as compared to when only one plane group P_1 is selected. Therefore, a bit line shutoff signal BLSHF_2 transmitted to the two plane groups P_2 and which transitions from the precharge voltage V_PRE to the developing voltage V_DEV may have a gentle gradient, as compared to a bit line shutoff signal BLSHF_1 transmitted to the one plane group P_1.

Due to a difference in gradients of the bit line shutoff signal BLSHF_1 transmitted to the one plane group P_1 and the bit line shutoff signal BLSHF_2 transmitted to the two plane groups P_2, transition times at which the bit line setup signal BLSETUP transitions from the logic low V_SS to the logic high V_DD may be different from each other. For example, when the one plane group P_1 is selected, a bit line setup signal BLSETUP_1 may transition from the logic low V_SS to the logic high V_DD at a first transition time t2_1'. On the other hand, when the two plane groups P_2 are selected, a bit line setup signal BLSETUP_2 may transition from the logic low V_SS to the logic high V_DD at a second transition time t2_2', which is later than the first transition time t2_1'. Therefore, data sensing at a high speed is possible when the one plane group P_1 is selected, and a sufficient precharge time may be obtained and accurate data sensing is possible when the two plane groups P_2 are selected.

According to FIG. 13, the first transition time t2_1' and the second transition time t2_2' are at points in time when the bit line shutoff signal BLSHF is constantly reduced (i.e., between times t_pre and t_dev_1 for the bit line shutoff signal BLSHF_1, and between times t_pre and t_dev_2 for the bit line shutoff signal BLSHF_2) when the one plane group P_1 is selected and when the two plane groups P_2 are selected, but the inventive concept is not limited thereto. In example embodiments, a transition time when the bit line setup signal BLSETUP transits from the logic low V_SS to the logic high V_DD may refer to or correspond to a moment when the bit line shutoff signal BLSHF has a value of the developing voltage V_DEV.

A gradient at which the bit line shutoff signal BLSHF transitions from the precharge voltage V_PRE to the developing voltage V_DEV may vary depending on magnitudes of the precharge voltage V_PRE and the developing voltage V_DEV. Therefore, the first transition time t2_1' when the one plane group P_1 is selected, and the second transition time t2_2' when the two plane groups P_2 are selected, may vary depending on magnitudes of the precharge voltage V_PRE and the developing voltage V_DEV.

Figures 14, 15:
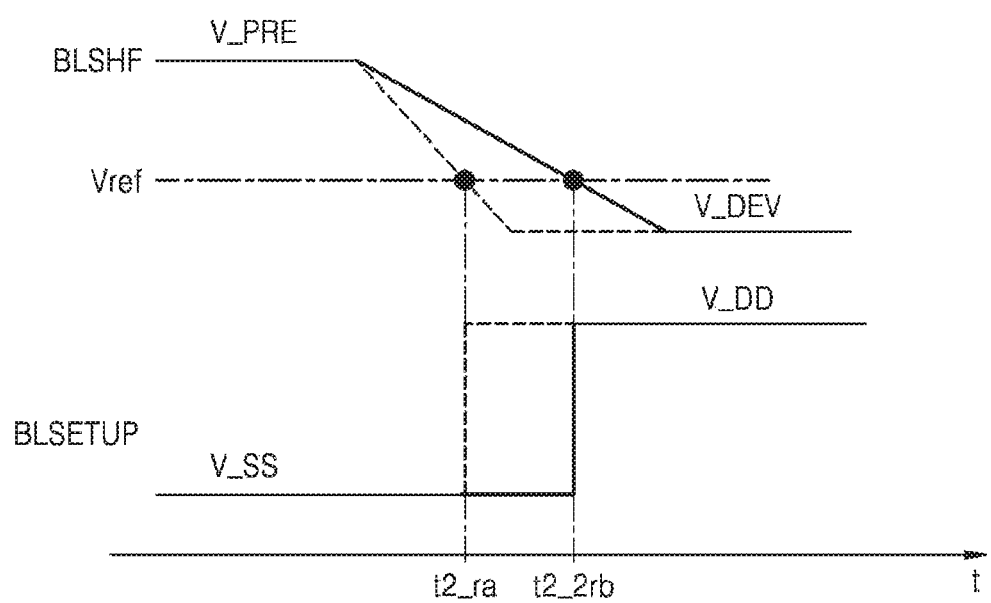
FIG. 14 illustrates a table for explaining an interval value of a bit line setup signal in a nonvolatile memory device, according to example embodiments of the inventive concept.
FIG. 15 illustrates a timing diagram of a part of a precharge operation and a part of a developing operation in a read operation, according to example embodiments of the inventive concept.

FIG. 14 illustrates a table for explaining an interval value of a bit line setup signal in a nonvolatile memory device, according to example embodiments of the inventive concept.

Referring to FIGS. 5 and 14, the control logic circuit 300 may transmit the bit line setup signal BLSETUP to each of the plurality of page buffers Page Buffer1 through Page Buffer16 to read data stored in each of the plurality of planes Plane1 through Plane16, and the bit line shutoff signal generator 500 may transmit the bit line shutoff signal BLSHF to each of the plurality of page buffers Page Buffer1 through Page Buffer16. The number of plane groups selected to perform a read operation may vary from case to case. Depending on the number of the selected plane groups to perform a read operation, gradients of the bit line shutoff signal BLSHF, which is received by the selected plane groups and which transitions from the precharge voltage V_PRE to the development voltage V_DEV, may be different from each other.

Information corresponding to and indentifying a set (i.e., predetermined) transition time of a bit line setup signal BLSETUP corresponding to the number of the selected plane groups to perform a read operation may be stored in the control logic circuit 300. The transition time may refer to a point in time when the bit line setup signal BLSETUP transitions from the logic low V_SS to the logic high V_DD. The information corresponding to the transition time may refer to, for example, an interval value of time from a point in time when the bit line shutoff signal BLSHF starts to decrease at a first level (i.e., a point in time when a gradient starts, t_pre of FIG. 13) to the transition time.

For example, interval values of the bit line setup signal BLSETUP respectively corresponding to when only one plane group is selected, when two plane groups are selected, when four plane groups are selected, and when eight plane groups are selected may be a first interval value t2_A', a second interval value t2_B', a third interval value t2_C', and a fourth interval value t2_D'. The interval may increase from the first interval value t2_A', the second interval value t2_B', the third interval value t2_C', toward the fourth interval value t2_D'. That is, the second interval value t2_B' may be greater than the first interval value t2_A', the third interval value t2_C' may be greater than the second interval value t2_B', and the fourth interval value t2_D' may be greater than the third interval value t2_C'. Only the case where the number of plane groups selected for a read operation is 1, 2, 4, or 8 is explained above. However, in example embodiments of the inventive concept, interval values for various other numbers of plane groups selected may be included.

When the control logic circuit 300 performs a read operation on the first through 16th plane groups, the control logic circuit 300 may control a transition time of the bit line setup signal BLSETUP transmitted to the first through 16th plane groups according to the number of the selected plane groups to perform a read operation. The control logic circuit 300 is configured to delay the transition time of the bit line setup signal BLSETUP by the corresponding interval value according to the number of planes on which a read operation is simultaneously performed. The interval value selected is greater, and consequently the corresponding delay is increased, as the number of planes on which the read operation is simultaneously performed is increased. In other words, the control logic circuit 300 is configured to simultaneously perform a read operation on at least some of the plurality of planes, and as a number of the at least some of the plurality of planers is increased, the control logic circuit 300 is configured to increase the interval value, and consequently the delay of the transition time. The control logic circuit 300 is configured to store information corresponding to set transition times for various numbers of the plurality of planes available for a simultaneous read operation.

FIG. 15 illustrates a timing diagram of a part of a precharge operation and a part of a developing operation in a read operation, according to example embodiments of the inventive concept.

Referring to FIGS. 5 and 15, the control logic circuit 300 may transmit the bit line setup signal BLSETUP to each of the plurality of page buffers Page Buffer1 through Page Buffer16 to read data stored in each of the plurality of planes Plane1 through Plane16, and the bit line shutoff signal generator 500 may transmit bit line shutoff signals BLSHF to each of the plurality of page buffers Page Buffer1 through Page Buffer16.

The nonvolatile memory device 1 may include a comparator (not shown) for comparing a level of a reference voltage Vref with that of the bit line shutoff signal BLSHF while the bit line shutoff signal BLSHF transitions from the precharge voltage V_PRE to the developing voltage V_DEV. The control logic circuit 300, based on an output value of the comparator, may change a level of the bit line setup signal BLSETUP from the logic low V_SS to the logic high V_DD when the bit line shutoff signal BLSHF becomes equal to the level of the reference voltage Vref.

As a transmission distance of the bit line shutoff signal BLSHF to each plane group increases, a gradient transitioning from the precharge voltage V_PRE to the developing voltage V_DEV of the bit line shutoff signal BLSHF may be gentle. Accordingly, when the transmission distance is shorter, a level of the bit line setup signal BLSETUP may be changed from the logic low V_SS to the logic high V_DD at a first transition time t2_ra, and when the transmission distance is longer, a level of the bit line setup signal BLSETUP may be changed from the logic low V_SS to the logic high V_DD at a second transition time t2_rb. Accordingly, by changing a level of the bit line setup signal BLSETUP based on the comparison of the level of the reference voltage Vref with the bit line shutoff signal BLSHF, the control logic circuit 300 may in effect control a point in time when the bit line setup signal BLSETUP is changed according to the distance by which the shutoff signal BLSHF is transmitted to a page buffer.

Furthermore, as the number of plane groups selected for performing a read operation increases, gradients of the bit line shutoff signal BLSHF, which is received by the selected plane groups and transitions from the precharge voltage V_PRE to the development voltage V_DEV, may be gentle. Accordingly, when the number of simultaneously selected plane groups for a read operation is small, a level of the bit line setup signal BLSETUP may be changed from the logic low V_SS to the logic high V_DD at the first transition time t2_ra, and when the number of simultaneously selected plane groups for a read operation is large, a level of the bit line setup signal BLSETUP may be changed from the logic low V_SS to the logic high V_DD at the second transition time t2_rb. Accordingly, by changing a level of the bit line setup signal BLSETUP based on the comparison of the level of the reference voltage Vref with the bit line shutoff signal BLSHF, the control logic circuit 300 may in effect control a point in time when the bit line setup signal BLSETUP is changed according to the number of planes simultaneously selected for a read operation.

The level of the reference voltage Vref may be determined based on a sensing margin of a page buffer connected to each plane selected to perform a read operation. As described above with reference to FIGS. 8A and 8B, if a precharge interval is not sufficiently long, a level of the bit line BL voltage becomes lower than when the bit line BL is sufficiently precharged. Thus, the memory cell MC may be sensed as if it is in an ON state. Therefore, as the sensing margin of the page buffer becomes narrower, the time of the precharge operation needs to be increased to ensure accuracy of data sensing, and the level of the reference voltage Vref may therefore be set low. Meanwhile, if the sensing margin of the page buffer is sufficient, the page buffer may sense an ON/OFF state even if the precharge operation is short, and the level of the reference voltage Vref may therefore be set high to reduce the total time required for a read operation.

FIG. 16 illustrates a diagram of a plane group including a page buffer 200a of a Quadruple Bit Line (QBL) structure, according to example embodiments of the inventive concept. The plane group in FIG. 16 may correspond to any of the plurality of plane groups in FIG. 5, and the plane 100a in FIG. 16 may correspond to any of the plurality of planes in FIG. 5. The page buffer 200a may correspond to any of the plurality of page buffers in FIG. 5.

Referring to FIG. 16, the plane 100a may be connected to a plurality of bit lines BL1 to BL_4$i$, where i is an integer equal to or greater than 3 and where "4$i$" should be understood to mean "4 multiplied by i". The page buffer 200a may include a plurality of page buffers 201a, 202a and 203a. In example embodiments, the number of the plurality of page buffers 201a to 203a may be i, and the number of the plurality of bit lines BL1 to BL_4$i$ may be 4$i$. Here, four bit lines (for example, BL1 to BL4) may be connected to a single page buffer (for example, 201a), and accordingly, the page buffer 200a may be referred to as a page buffer having a QBL structure.

In the present example embodiment, the plurality of bit lines BL1 to BL_4$i$ may be divided into first through fourth bit line groups BLG1 to BLG4, and a reading order of the first through fourth bit line groups BLG1 to BLG4 may be different. For example, the first bit line group BLG1 may include the bit lines BL1, BL5, and BL_4$i$-3, the second bit line group BLG2 may include the bit lines BL2, BL6, and BL_4$i$-2, the third bit line group BLG3 may include the bit lines BL3, BL7, and BL_4$i$-1, and the fourth bit line group BLG4 may include the bit lines BL4, BL8, and BL_4$i$.

For example, the first through fourth bit lines BL1 to BL4 respectively included in the first through fourth bit line groups BLG1 to BLG4 may share the single page buffer 201a. Here, read operations for the first through fourth bit line groups BLG1 to BLG4, that is, read operations for memory cells connected to the first through fourth bit lines BL1 to BL4 may be performed sequentially. In the present specification, a reading method for a memory device including the page buffer 200a having a QBL structure has been described above. However, the inventive concept is not limited to page buffers having QBL structures, and the reading method may be applied to memory devices including page buffers having structures illustrated in FIGS. 17 and 18.

FIG. 17 illustrates a view of a plane group including a page buffer 200b having a Shielded Bit Line (SBL) structure, according to example embodiments of the inventive concept. The plane group in FIG. 17 may correspond to any of the plurality of plane groups in FIG. 5, and the plane 100b in FIG. 17 may correspond to any of the plurality of planes in FIG. 5. The page buffer 200b may correspond to any of the plurality of page buffers in FIG. 5.

Referring to FIG. 17, the plane 100b may be connected to the plurality of bit lines BL1 to BL_2$i$, where i is an integer equal to or greater than 3 and where "2$i$" should be understood to mean "2 multiplied by i". The page buffer 200b may include a plurality of page buffers 201b, 202b and 203b. In example embodiments, the number of the plurality of page buffers 201b to 203b may be i, and the number of the plurality of bit lines BL1 to BL_2$i$ may be 2$i$. Here, two bit lines (for example, BL1 and BL2) may be connected to a page buffer (for example, 201b), and accordingly, the page buffer 200b may be referred to as a page buffer having a SBL structure.

In the present example embodiment, the plurality of bit lines BL1 to BL_2$i$ may be divided into first and second bit line groups BLG1 and BLG2, and a reading order of the first and second bit line groups BLG1 and BLG2 may be different. For example, the first bit line group BLG1 may include the bit lines BL1, BL3, and BL_2$i$-1, and the second bit line group BLG2 may include the bit lines BL2, BL4, and BL_2$i$. For example, the first and second bit lines BL1 and BL2 respectively included in the first and second bit line groups BLG1 and BLG2 may share the page buffer 201b. Here, read operations for the first and second bit line groups BLG1 and BLG2, that is, read operations for memory cells connected to the first and second bit lines BL1 and BL2 may be performed sequentially.

FIG. 18 illustrates a view of a nonvolatile memory device including a page buffer 200c having an All Bit Line (ABL) structure, according to example embodiments of the inventive concept. A plane group in FIG. 18 may correspond to any of the plurality of plane groups in FIG. 5, and the plane 100c in FIG. 18 may correspond to any of the plurality of planes in FIG. 5. The page buffer 200c may correspond to any of the plurality of page buffers in FIG. 5.

Referring to FIG. 18, the plane 100c may be connected to the plurality of bit lines BL1 to BL_2i, where i is an integer equal to or greater than 3 and where "2i" should be understood to mean "2 multiplied by i". The page buffer 200c may include a plurality of page buffers 201c to 206c. In example embodiments, the number of the plurality of page buffers 201c to 206c may be i, and the number of the plurality of bit lines BL1 to BL_2i may be 2i. Here, each bit line (for example, BL1) may be connected to a respective page buffer (for example, 201c), and accordingly, the page buffer 200c may be referred to as a page buffer having an ABL structure.

In the present example embodiment, the plurality of bit lines BL1 to BL_2i may be divided into first and second bit line groups BLG1 and BLG2, and a reading order of the first and second bit line groups BLG1 and BLG2 may be different. For example, the first bit line group BLG1 may include the bit lines BL1, BL3, and BL_2i-1, and the second bit line group BLG2 may include the bit lines BL2, BL4, and BL_2i. Here, read operations for the first and second bit line groups BLG1 and BLG2, that is, read operations for memory cells connected to the first and second bit lines BL1 and BL2 may be performed sequentially. However, the inventive concept is not limited thereto, and in example embodiments the plurality of bit lines BL1 to BL_2i may be divided into three or more bit line groups.

Figure 19:
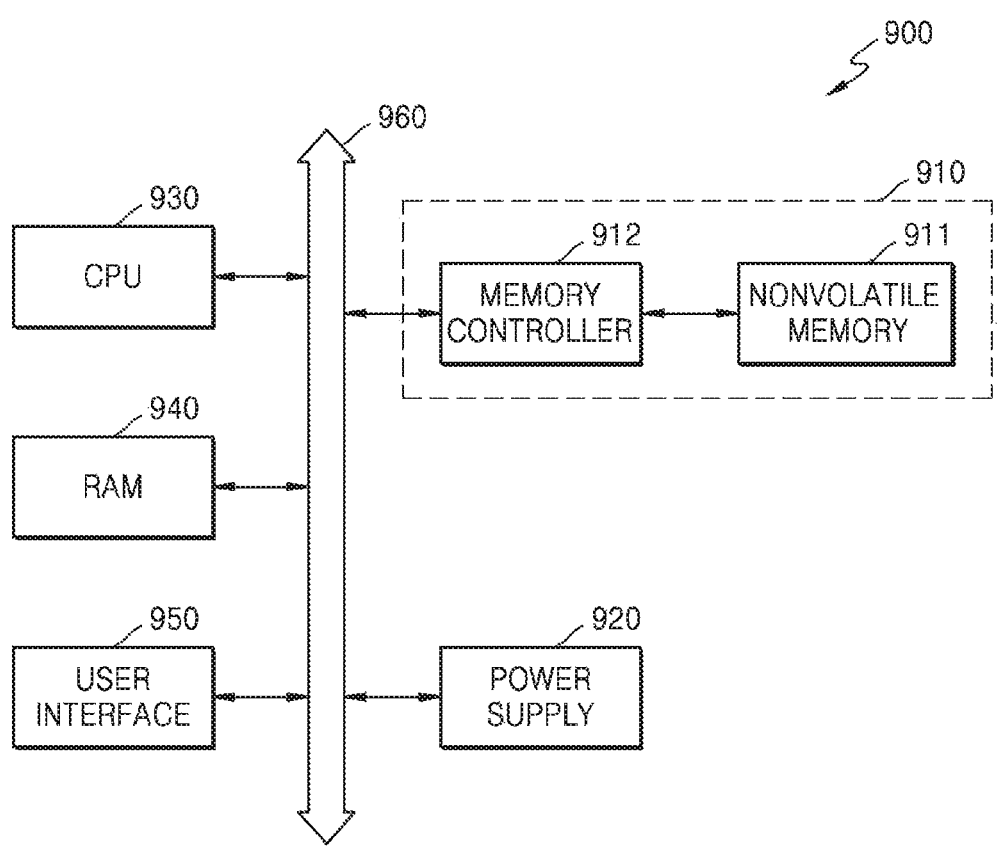
FIG. 19 illustrates a block diagram of a computing system device including a nonvolatile memory device, according to example embodiments of the inventive concept.

FIG. 19 illustrates a block diagram of a computing system device 900 including a nonvolatile memory device, according to example embodiments of the inventive concept.

Referring to FIG. 19, the computing system device 900 includes a central processing unit (CPU) 930 electrically connected to a bus 960, a user interface 950, and a nonvolatile memory system 910 having a memory controller 912 and a nonvolatile memory device 911. The nonvolatile memory device 911 may store N-bit data processed/to be processed by the CPU 930 (N is an integer equal to or greater than 1) through the memory controller 912. In addition, the nonvolatile memory device 911 may also include nonvolatile memory devices described in FIGS. 1 through 18. Therefore, the computing system device 900 may reduce time taken to read the data stored in the nonvolatile memory device 911 and ensure accuracy of the data. The computing system device 900 may further include random-access memory (RAM) 940 and a power supply 920.

In the case that the computing system device 900 is a mobile device, a battery for supplying an operating voltage of the computing system device and a modem such as a baseband chipset may be additionally provided. Furthermore, it is to be understood by those of ordinary skilled in the art that the computing system device 900 may also be provided with for example an application chipset, a camera image processor (CIS), a mobile DRAM, and the like, and therefore, detailed descriptions thereof will not be given herein.

The memory controller 912 and the nonvolatile memory device 911 may include, e.g., a Solid State Drive/Disk (SSD) using a nonvolatile memory for storing data.

While the inventive concept has been particularly shown and described with reference to example embodiments thereof, it will be understood that various changes in form and details may be made therein without departing from the spirit and scope of the following claims.

What is claimed is:

1. A nonvolatile memory device comprising:
a memory cell array including a plurality of planes;
a plurality of page buffers arranged corresponding to each of the plurality of planes; and
a control logic circuit configured to transmit a bit line setup signal to each of the plurality of page buffers, wherein
each of the plurality of page buffers comprises a precharge circuit configured to precharge a sensing node and a bit line in response to the bit line setup signal, and a shutoff circuit configured to perform a bit line shutoff operation in response to a bit line shutoff signal, and
the control logic circuit is configured to control a transition time when a level of the bit line setup signal is changed according to a gradient of the bit line shutoff signal which is changed from a first level to a second level.

2. The nonvolatile memory device of claim 1, wherein each of the plurality of page buffers comprises a first page buffer and a second page buffer,
wherein a plurality of bit lines included in the plurality of planes are configured to form a first bit line group and a second bit line group, and
wherein the first page buffer is connected to a single bit line of the first bit line group and a single bit line of the second bit line group, and the second page buffer is connected to another bit line of the first bit line group and another bit line of the second bit line group.

3. The nonvolatile memory device of claim 1, wherein the control logic circuit is configured to delay the transition time of the bit line setup signal according to a transmission distance by which the bit line shutoff signal is transmitted to a page buffer from among the plurality of page buffers, and to increase the delay as the transmission distance is increased.

4. The nonvolatile memory device of claim 3, wherein the control logic circuit is configured to store information corresponding to a set transition time of each of the plurality of planes based on the transmission distance, and to transmit the bit line setup signal to the plurality of page buffers based on the information.

5. The nonvolatile memory device of claim 1, wherein the control logic circuit is configured to simultaneously perform a read operation on at least some of the plurality of planes.

6. The nonvolatile memory device of claim 5, wherein as a number of the at least some of the plurality of planes increases, the control logic circuit is configured to delay the transition time.

7. The nonvolatile memory device of claim 6, wherein the control logic circuit is configured to store information corresponding to set transition times for various numbers of the plurality of planes available for the read operation, and to transmit the bit line setup signal to page buffers connected to the at least some of the plurality of planes based on the information.

8. The nonvolatile memory device of claim 1, wherein the transition time is a point in time when a level of the bit line shutoff signal reaches the second level.

9. The nonvolatile memory device of claim 1, wherein the control logic circuit is configured to adjust the transition time based on a difference value between the first level and the second level of the bit line shutoff signal.

10. The nonvolatile memory device of claim 1, wherein the shutoff circuit comprises a transistor, and the transistor is turned on and off according to the bit line shutoff signal.

11. A nonvolatile memory device comprising:
a memory cell array including a plurality of planes;
a plurality of page buffers connected to each of the plurality of planes; and
a control logic circuit configured to transmit a bit line setup signal to each of the plurality of page buffers, wherein
each of the plurality of page buffers comprises a precharge circuit configured to precharge a sensing node and a bit line in response to the bit line setup signal, and a shutoff circuit configured to perform a bit line shutoff operation in response to a bit line shutoff signal, and
the control logic circuit is configured to change a level of the bit line setup signal based on a result of comparing a level of the bit line shutoff signal with a level of a reference voltage.

12. The nonvolatile memory device of claim 11, wherein the level of the reference voltage is determined based on a sensing margin for sensing on-cells and off-cells of each of the plurality of page buffers connected to each of the plurality of planes.

13. The nonvolatile memory device of claim 11, wherein according to the comparing of the level of the bit line shutoff signal with the level of the reference voltage by the control logic circuit, a point in time when the level of the bit line setup signal is changed is controlled according to a number of planes simultaneously selected for a read operation.

14. The nonvolatile memory device of claim 11, wherein according to the comparing of the level of the bit line shutoff signal with the level of the reference voltage by the control logic circuit, a point in time when the level of the bit line setup signal is changed is controlled according to a distance by which the bit line shutoff signal is transmitted to each of the plurality of page buffers.

15. The nonvolatile memory device of claim 11, wherein the control logic circuit is configured to control the plurality of page buffers to simultaneously develop the bit line and the sensing node.

16. A nonvolatile memory device comprising:
a memory cell array including a plurality of planes;
a plurality of page buffers arranged as respectively corresponding to the plurality of planes,
wherein each of the plurality of page buffers is configured to precharge a sensing node and a bit line in a corresponding plane of the plurality planes responsive to a bit line setup signal, and to perform a shutoff operation responsive to a bit line shutoff signal; and
a control logic circuit configured to generate the bit line setup signal as having a level that is changed at a transition time controlled according to a gradient of the bit line shutoff signal.

17. The nonvolatile memory device of claim 16, wherein the control logic circuit is configured to delay the transition time of the bit line setup signal from a point in time when the bit line shutoff signal starts to decrease from a first level to a second level.

18. The nonvolatile memory device of claim 17, wherein the control logic circuit is configured to simultaneously perform a read operation on at least some of the plurality of planes, and to determine the delay according to a number of the plurality of planes on which the read operation is simultaneously performed.

19. The nonvolatile memory device of claim 17, wherein the control logic circuit is configured to determine the delay according to a transmission distance by which the bit line shutoff signal is transmitted to a page buffer from among the plurality of page buffers during a read operation.

20. The nonvolatile memory device of claim 16, wherein the control logic circuit is configured to change the level of the bit line setup signal based on a result of comparing the level of the bit line shutoff signal with a level of a reference voltage.

* * * * *